(12) United States Patent
Cho et al.

(10) Patent No.: US 11,561,331 B2
(45) Date of Patent: Jan. 24, 2023

(54) COMBINATION STRUCTURES AND OPTICAL FILTERS AND IMAGE SENSORS AND CAMERA MODULES AND ELECTRONIC DEVICES

(71) Applicant: Samsung Electronics Co., Ltd., Suwon-si (KR)

(72) Inventors: Chung Kun Cho, Suwon-si (KR); Mi Jeong Kim, Hwaseong-si (KR); Hye Ran Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 315 days.

(21) Appl. No.: 16/890,138

(22) Filed: Jun. 2, 2020

(65) Prior Publication Data
US 2021/0072439 A1    Mar. 11, 2021

(30) Foreign Application Priority Data

Sep. 10, 2019 (KR) .......................... 10-2019-0112337

(51) Int. Cl.
*G02B 5/20* (2006.01)
*H01L 27/146* (2006.01)

(52) U.S. Cl.
CPC ........ *G02B 5/208* (2013.01); *H01L 27/14621* (2013.01); *G02B 2207/101* (2013.01)

(58) Field of Classification Search
CPC .......... G02B 5/208; G02B 5/22; G02B 5/201; G02B 2207/101; G02B 7/08; G02B 1/002; H01L 27/14621; H01L 27/14625
See application file for complete search history.

(56) References Cited

U.S. PATENT DOCUMENTS

| | | | |
|---|---|---|---|
| 9,479,645 B2 | 10/2016 | Moore et al. | |
| 9,848,087 B2 | 12/2017 | Moore et al. | |
| 10,408,979 B2 | 9/2019 | Yoshioka et al. | |
| 2002/0046851 A1 | 4/2002 | Marutsuka | |

(Continued)

FOREIGN PATENT DOCUMENTS

| | | |
|---|---|---|
| CN | 102856663 B | 7/2014 |
| CN | 104535197 A | 4/2015 |

(Continued)

OTHER PUBLICATIONS

Spinelli, Pierpaolo et al., "Light Trapping in Thin Crystalline Si Solar Cells Using Surface Mie Scatterers", IEEE Journal of Photovoltaics, vol. 4, No. 2, pp. 554-559, Mar. 2014.

*Primary Examiner* — Sitaramarao S Yechuri
(74) *Attorney, Agent, or Firm* — Harness, Dickey & Pierce, P.L.C.

(57) ABSTRACT

A combination structure includes a hybrid nanostructure array and a light-absorbing layer adjacent to the hybrid nanostructure array. The hybrid nanostructure array includes a plurality of hybrid nanostructures, each hybrid nanostructure includes a stack of a first nanostructure and a second nanostructure. The first nanostructure includes a first material. The second nanostructure includes a second material. The second material has a refractive index that is higher than a refractive index of the first material. The light-absorbing layer includes a near-infrared absorbing material configured to absorb light of at least a portion of a near-infrared wavelength spectrum.

29 Claims, 31 Drawing Sheets

(56) References Cited

U.S. PATENT DOCUMENTS

| | | | |
|---|---|---|---|
| 2006/0144713 | A1 | 7/2006 | Song et al. |
| 2010/0053035 | A1 | 3/2010 | Lee et al. |
| 2010/0092879 | A1* | 4/2010 | Minegishi ............ G03F 7/0233 430/18 |
| 2012/0161090 | A1 | 6/2012 | Zhu et al. |
| 2017/0150071 | A1* | 5/2017 | Otsubo ............ H01L 27/14868 |
| 2017/0363959 | A1 | 12/2017 | Takahashi et al. |
| 2018/0319989 | A1 | 11/2018 | Haraguchi et al. |
| 2018/0346729 | A1 | 12/2018 | Miyake et al. |
| 2020/0064195 | A1* | 2/2020 | Gallinet ................ G02B 5/201 |

FOREIGN PATENT DOCUMENTS

| | | |
|---|---|---|
| CN | 107329285 A | 11/2017 |
| JP | 3102496 B2 | 10/2000 |
| JP | 2002-198688 A | 7/2002 |
| JP | 2008-181097 A | 8/2008 |
| JP | 2009-227860 A | 10/2009 |
| JP | 2016-528498 A | 9/2016 |
| JP | 2016-204536 A | 12/2016 |
| KR | 10-2004-0043936 A | 5/2004 |
| KR | 10-2006-0058560 A | 5/2006 |
| KR | 10-0581856 B1 | 5/2006 |
| KR | 10-1047946 B1 | 7/2011 |
| KR | 10-2012-0022815 A | 3/2012 |
| KR | 10-2012-0078435 A | 7/2012 |
| KR | 10-2016-0032038 A | 3/2016 |
| KR | 10-1661677 B1 | 9/2016 |
| KR | 10-2017-0023160 A | 3/2017 |
| KR | 10-2017-0057739 A | 5/2017 |
| KR | 10-2017-0120654 A | 10/2017 |
| KR | 10-1809073 B1 | 12/2017 |
| KR | 10-1869710 B1 | 7/2018 |
| KR | 10-2018-0094005 A | 8/2018 |
| KR | 10-2018-0104727 A | 9/2018 |
| KR | 10-2019-0022340 A | 3/2019 |

* cited by examiner

COMBINATION STRUCTURES AND OPTICAL FILTERS AND IMAGE SENSORS AND CAMERA MODULES AND ELECTRONIC DEVICES

CROSS-REFERENCE TO RELATED APPLICATION

This application claims priority to and the benefit of, under 35 U.S.C. § 119, Korean Patent Application No. 10-2019-0112337 filed in the Korean Intellectual Property Office on Sep. 10, 2019, the entire contents of which are incorporated herein by reference.

BACKGROUND

1. Field

Combination structures, optical filters, image sensors, camera modules, and electronic devices are disclosed.

2. Description of the Related Art

Electronic devices including an image sensor that stores an image as an electrical signal, such as cell phones, digital cameras, camcorders, and cameras, have been widely used.

An electronic device may include an optical filter in order to reduce generation of an optical distortion by light in the other regions (e.g., other wavelength spectra) than a visible region (e.g., visible wavelength spectrum) or improve visibility by light in the other regions than a visible region.

SUMMARY

Some example embodiments provide a combination structure capable of achieving desired optical properties for light except for visible regions with a thin thickness.

Some example embodiments provide an optical filter including the combination structure.

Some example embodiments provide an image sensor including the combination structure or the optical filter.

Some example embodiments provide a camera module including the combination structure, the optical filter, or the image sensor.

Some example embodiments provide an electronic device including the combination structure, the optical filter, the image sensor, or the camera module.

According to some example embodiments, a combination structure may include a hybrid nanostructure array and a light-absorbing layer adjacent to the hybrid nanostructure array. The hybrid nanostructure array may include a plurality of hybrid nanostructures. Each hybrid nanostructure of the plurality of hybrid nanostructures may include a stack of a first nanostructure and a second nanostructure. The first nanostructure may include a first material. The second nanostructure may include a second material. The second material may have a refractive index that is higher than a refractive index of the first material. The light-absorbing layer may include a near-infrared absorbing material configured to absorb light of at least a portion of a near-infrared wavelength spectrum.

One or more hybrid nanostructures of the hybrid nanostructure array may have a dimension that is smaller than a particular near-infrared wavelength.

The particular near-infrared wavelength may be in a range of greater than about 700 nm and less than or equal to about 1200 nm.

The particular near-infrared wavelength may be in a range of about 890 nm to about 990 nm.

The first material may include a metal having a refractive index of less than about 1.0 in a wavelength range of about 900 nm to about 1000 nm.

The first material may include gold, silver, copper, an alloy thereof, or a combination thereof.

The refractive index of the second material may be greater than or equal to about 2.0 in a wavelength range of about 900 nm to about 1000 nm.

The second material may include a metal oxide, silicon, a Group III-V semiconductor compound, or a combination thereof.

The first material may include gold, silver, copper, an alloy thereof, or a combination thereof, and the second material may include a metal oxide, silicon, a Group III-V semiconductor compound, or a combination thereof.

A thickness of the first nanostructure may be smaller than a thickness of the second nanostructure.

The thickness of the first nanostructure may be in a range of about 5 nm to about 50 nm, and the thickness of the second nanostructure may be in a range of about 10 nm to about 700 nm.

The near-infrared absorbing material may be configured to absorb light of at least a portion of a wavelength in a wavelength range of greater than about 700 nm and less than or equal to about 1200 nm.

A maximum absorption wavelength of the near-infrared absorbing material may be in a wavelength range of about 890 nm to about 990 nm.

The light-absorbing layer may contact at least one of a lower surface, an upper surface, or one or more side surfaces of one or more hybrid nanostructures of the plurality of hybrid nanostructures.

An optical spectrum of the combination structure may have a maximum absorption wavelength in a wavelength range of greater than about 700 nm and less than or equal to about 1200 nm, and transmittance at the maximum absorption wavelength may be less than or equal to about 50%.

The combination structure may have an average transmittance of less than or equal to about 50% in a wavelength spectrum of about 890 nm to about 990 nm.

The combination structure may have an average transmittance of greater than or equal to about 75% in a wavelength spectrum of about 430 nm to about 565 nm.

A reflectance at the maximum absorption wavelength of the combination structure may be less than about 40%.

A thickness of the combination structure may be less than or equal to about 1 μm.

An optical filter may include the combination structure.

According to some example embodiments, an image sensor may include a semiconductor substrate including a plurality of photodiodes, and an optical filter on the semiconductor substrate, where the optical filter is configured to block light of at least a portion of a near-infrared wavelength spectrum, and where the optical filter includes the combination structure.

The image sensor may further include a color filter on the semiconductor substrate. The color filter may be above or beneath the optical filter.

The image sensor may further include a dual bandpass filter. The dual bandpass filter may be configured to selectively transmit light of an entirety of a visible wavelength spectrum and the portion of the near-infrared wavelength spectrum.

A camera may include the optical filter.

A camera may include the image sensor.

An electronic device may include the optical filter, the image sensor, and/or the camera.

The optical filter may effectively increase the transmittance of the light in the visible wavelength spectrum and effectively reduce the transmittance of the light in the near-infrared spectrum with a thin thickness.

DETAILED DESCRIPTION

Figure 1:
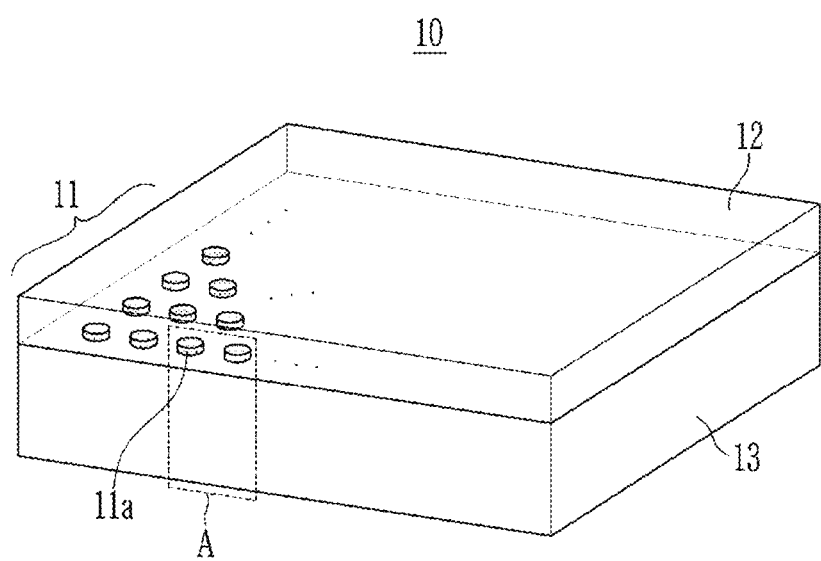
FIG. 1 is a schematic view showing an example of a combination structure according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a combination structure according to some example embodiments is described with reference to drawings.

Figure 2:
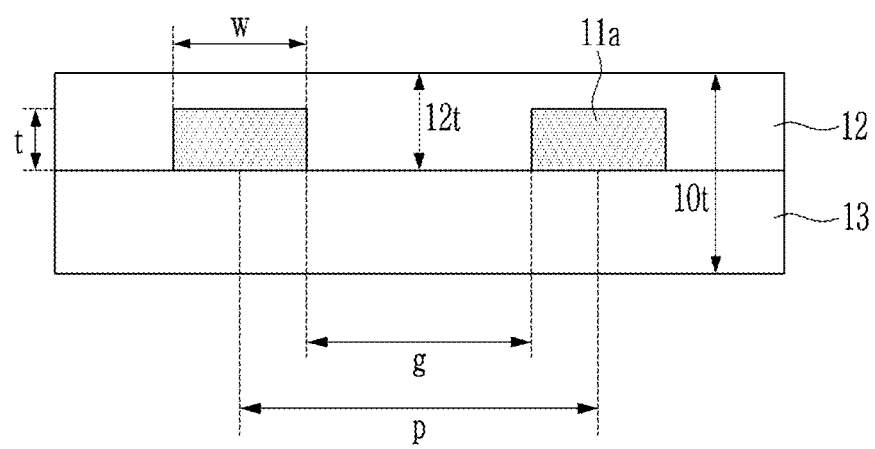
FIG. 2 is a cross-sectional view showing an enlarged portion A of the combination structure of FIG. 1, FIGS. 3, 4, 5, and 6 are cross-sectional views showing examples of hybrid nanostructures.

FIG. 1 is a schematic view showing an example of a combination structure according to some example embodiments, FIG. 2 is a cross-sectional view showing an enlarged portion A of the combination structure of FIG. 1, and FIGS. 3, 4, 5, and 6 are cross-sectional views showing examples of hybrid nanostructures.

A combination structure 10 according to some example embodiments includes a hybrid nanostructure array 11, a light-absorbing layer 12, and a base layer 13.

The hybrid nanostructure array 11 may be a structure satisfying optical properties called metamaterials or metastructures, and may include a plurality of hybrid nanostructures 11a arranged repeatedly or periodically (e.g., in a pattern) along an in-plane direction. Restated, the hybrid nanostructure array 11 may include a pattern arrangement (e.g., an "array") of hybrid nanostructures 11. The plurality of hybrid nanostructures 11a may be for example repeatedly or periodically arranged along a row and/or column to establish the hybrid nanostructure array 11.

The hybrid nanostructures 11a may be three-dimensional structures having a particular (or, alternatively, predetermined) width (w) and thickness (t) and may have, in some example embodiments, a cuboid shape, a cube shape, a cylindrical shape, or a disk shape, but are not limited thereto. A cross-sectional shape of the hybrid nanostructures 11a may be, in some example embodiments, a rectangle or a square.

The hybrid nanostructures 11a may be arranged with a particular (or, alternatively, predetermined) period (p) and/or gap (g), wherein the period (p) may be a length between centers of the adjacent hybrid nanostructures 11a and the gap (g) may be a length between facing surfaces of the adjacent hybrid nanostructures 11a.

Referring to FIGS. 3 to 6, the hybrid nanostructures 11a may each be a stack of at least one first nanostructure 11a-1 and at least one second nanostructure 11a-2. The first nanostructure 11a-1 and the second nanostructure 11a-2 may include different materials. In some example embodiments, the first nanostructure 11a-1 and the second nanostructure 11a-2 may include materials having different refractive indices. In some example embodiments, the first nanostructure 11a-1 may include a material (e.g., a first material) having a relatively low reflective index and the second nanostructure 11a-2 may include a material (e.g., a second material) having a relatively high reflective index (e.g., the second material may have a refractive index that is higher than a refractive index of the first material) In some example embodiments, the first nanostructure 11a-1 may include a relatively low refractive index material having a refractive index of less than about 1.0 in a range of about 900 nm to about 1000 nm (e.g., about 940 nm) and the second nanostructure 11a-2 may include a relatively high reflective index material having a refractive index of greater than or equal to about 2.0 in a range of about 900 nm to about 1000 nm (e.g., about 940 nm).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, the first nanostructure 11a-1 may include a metal, and may include a metal having a refractive index of for example less than about 1.0 in a range of about 900 nm to about 1000 nm (e.g., about 940 nm). Within the range, a refractive index of the first nanostructure 11a-1 may be, for example less than or equal to about 0.8, less than or equal to about 0.7, less than or equal to about 0.5, or less than or equal to about 0.3, for example greater than or equal to about 0.1 and less than about 1.0, about 0.1 to about 0.8, about 0.1 to about 0.7, about 0.1 to about 0.5, or about 0.1 to about 0.3. In some example embodiments, the first nanostructure 11a-1 may include (e.g., the first material may include) gold (Au), silver (Ag), copper (Cu), aluminum (Al), an alloy thereof, or a combination thereof, but is not limited thereto.

In some example embodiments, the second nanostructure 11a-2 may include a material except for pure metal, for example an insulator, a semiconductor, or combination thereof, and may include an insulator, a semiconductor, or a combination thereof having a refractive index of for example greater than or equal to about 2.0 in a range of about 900 nm to about 1000 nm (e.g., about 940 nm). Within the range, the refractive index of second nanostructure 11a-2 may be, in some example embodiments, greater than or equal to about 2.1, greater than or equal to about 2.3, greater than or equal to about 2.5, greater than or equal to about 2.8, greater than or equal to about 3.0, or greater than or equal to about 4.0, for example about 2.0 to about 5.0, about 2.1 to about 5.0, about 2.3 to about 5.0, about 2.5 to about 5.0, about 2.8 to about 5.0, about 3.0 to about 5.0, or about 4.0 to about 5.0. In some example embodiments, the second nanostructure 11a-2 may include (e.g., the second material may include) an oxide, a nitride, a sulfide, a semiconductor, a semiconductor compound, or a combination thereof, for example a metal oxide, a metal nitride, a metal sulfide, a semiconductor, a semiconductor compound, or a combination thereof, for example a titanium oxide, a zinc oxide, an indium oxide, a zirconium oxide, silicon, a Group III-V semiconductor compound, or a combination thereof, but is not limited thereto.

The hybrid nanostructures 11a may be implemented in various ways depending on the number and/or positions of the first nanostructure 11a-1 and the second nanostructure 11a-2.

Figure 3:
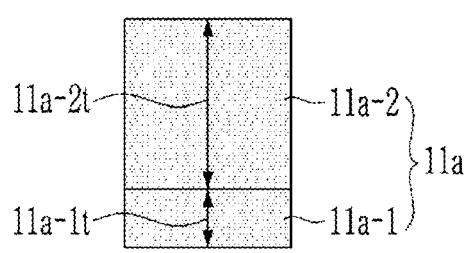

In some example embodiments, referring to FIG. 3, the hybrid nanostructures 11a may have a structure in which one first nanostructure 11a-1 and one second nanostructure 11a-2 are stacked. In some example embodiments, the first nanostructure 11a-1 may be disposed on the bottom and the second nanostructure 11a-2 may be disposed on the top. In some example embodiments, the first nanostructure 11a-1 may be disposed on top and the second nanostructure 11a-2 may be disposed on bottom.

Figure 4:
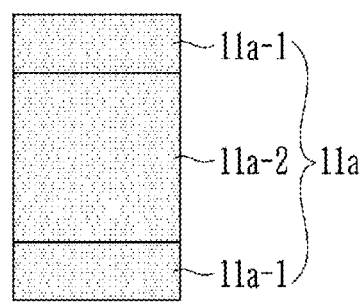

In some example embodiments, referring to FIG. 4, the hybrid nanostructures 11a may have a structure in which the first nanostructure 11a-1, the second nanostructure 11a-2, and the first nanostructure 11a-1 are stacked.

Figure 5:
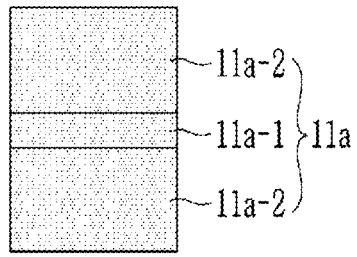

In some example embodiments, referring to FIG. 5, the hybrid nanostructures 11a may have a structure in which the second nanostructure 11a-2, the first nanostructure 11a-1, and the second nanostructure 11a-2 are stacked.

Figure 6:
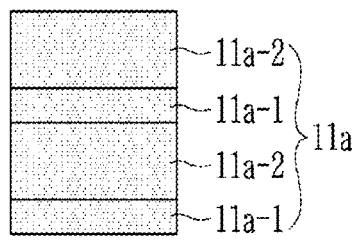

In some example embodiments, referring to FIG. 6, the hybrid nanostructures 11a may have a structure in which the first nanostructure 11a-1 and the second nanostructure 11a-2 are alternately stacked. Although the drawing shows a structure in which two layers of the first nanostructure 11a-1 and two layers of the second nanostructure 11a-2 are stacked, the present disclosure is not limited thereto and a plurality of the first nanostructures 11a-1 and a plurality of the second nanostructures 11a-2 may be stacked. In some example embodiments, of 2 to 5 layers of the first nanostructure 11a-1 and 2 to 5 layers of the second nanostructure 11a-2 may be alternately stacked.

The hybrid nanostructure array 11 and/or the hybrid nanostructures 11a may be configured to reflect or absorb light of a particular (or, alternatively, predetermined) wavelength and thus exhibit optical properties. For example, the hybrid nanostructure array 11 and/or the hybrid nanostructures 11a may be configured to reflect or absorb light of a desired wavelength by controlling a shape, geometry, dimension, and orientation of the hybrid nanostructures 11a and/or an arrangement of the hybrid nanostructure array 11. In some example embodiments, one or more dimensions of the hybrid nanostructure array 11 (e.g., associated with the hybrid nanostructure array 11) may be a subwavelength which is smaller than a wavelength of light for reflection or absorption. Herein, the one or more dimensions of the hybrid nanostructure array 11 may include one or more dimensions of (e.g., one or more dimensions associated with) one or more hybrid nanostructures 11a in the hybrid nanostructure array 11, and/or one or more dimensions associated therewith. Herein, the one or more dimensions of the hybrid nanostructure array 11 (e.g., one or more dimensions of one or more hybrid nanostructures 11a) may include a width, a thickness, a gap, and/or a period and when the hybrid nanostructures 11a has the cylindrical or disk shape, the width thereof may be a diameter. For example, the one or more dimensions of the hybrid nanostructure array 11 (which may include one or more dimensions of one or more hybrid nanostructures 11a therein) may include, for example, width (w), diameter, thickness (t), gap (g), period (p), any combination thereof, or the like that are associated with one or more of the hybrid nanostructures 11a in the hybrid nanostructure array 11). In some example embodiments, the dimension of the hybrid nanostructures 11a may be a width and a thickness.

In some example embodiments, the hybrid nanostructure array 11 may be configured to reflect or absorb light of a particular (or, alternatively, predetermined) wavelength belonging to a near-infrared wavelength spectrum, wherein one or more dimensions of (e.g., associated with) one or more of the hybrid nanostructures 11a and/or of (e.g., associated with) the hybrid nanostructure array 11 (e.g., width (w), diameter, thickness (t), gap (g), period (p), any combination thereof, or the like) may be less than the particular (or, alternatively, predetermined) near-infrared wavelength belonging to the near-infrared wavelength spectrum. Herein, the particular near-infrared wavelength spectrum may be in the range of greater than about 700 nm and less than or equal to about 1200 nm, within the range, for example about 750 nm to about 1100 nm, about 750 nm to about 1000 nm, about 800 nm to about 1000 nm, about 850 nm to about 990 nm, about 870 nm to about 990 nm, or about 890 nm to about 990 nm.

In some example embodiments, a width (w) of the hybrid nanostructures 11a may be several nanometers to several hundred nanometers, and within the range for example about 50 nm to about 800 nm, about 80 nm to about 500 nm, about 100 nm to about 500 nm, or about 120 nm to about 500 nm.

In some example embodiments, a thickness (t) of the hybrid nanostructures 11a may be several nanometers to several hundred nanometers, and within the range, for example about 15 nm to about 500 nm, about 20 nm to about 500 nm, about 30 nm to about 500 nm, about 50 nm to about 500 nm, or about 70 nm to about 500 nm.

In some example embodiments, a period (p) of the hybrid nanostructures 11a may be several nanometers to several hundred nanometers, and within the range, for example about 200 nm to about 800 nm, about 200 nm to about 700 nm, about 200 nm to about 600 nm, or about 200 nm to about 500 nm.

In some example embodiments, a gap (g) of the hybrid nanostructures 11a may be several nanometers to several hundred nanometers, and within the range, for example about 50 nm to about 700 nm, about 50 nm to about 600 nm, about 70 nm to about 500 nm, about 70 nm to about 450 nm, or about 80 nm to about 400 nm.

In some example embodiments, for example as shown in FIG. 3, a thickness 11a-1t of the first nanostructure 11a-1 may be smaller than a thickness 11a-2t of the second nanostructure 11a-2. In some example embodiments, the thickness 11a-1t of the first nanostructure 11a-1 may be about 2% to 90% of the thickness 11a-2t of the second nanostructure 11a-2, and within the range, about 5% to about 85%, about 5% to about 80%, or about 5% to about 70%. In some example embodiments, the thickness 11a-1t of the first nanostructure 11a-1 may be about 5 nm to about 100 nm, and within the range, about 5 nm to about 80 nm, about 5 nm to about 70 nm, about 5 nm to about 50 nm, about 10 nm to about 50 nm, or about 10 nm to about 30 nm. In some example embodiments, the thickness 11a-2t of the second nanostructure 11a-2 may be about 10 nm to about 700 nm, and within the range, about 10 nm to about 500 nm, about 20 nm to about 500 nm, about 30 nm to about 500 nm, about 50 nm to about 300 nm, or about 50 nm to about 200 nm.

The light-absorbing layer 12 is an area that absorbs light of a particular (or, alternatively, predetermined) wavelength. It is disposed (e.g., located) adjacently to the hybrid nanostructure array 11 and for example may be in contact with the hybrid nanostructure array 11. Restated, the light-absorbing layer 12 may be adjacent to the hybrid nanostructure array 11 and may be in contact with the hybrid nanostructure array 11. It will be understood that "contact" and "direct contact" may be used interchangeably herein. The light-absorbing layer 12 may be in contact with (e.g., may contact) at least one of a lower surface, an upper surface, or one or more side surfaces of one or more hybrid nanostructures 11a of the hybrid nanostructure array 11 and may be, in some example embodiments, in contact with the side and upper surfaces of the hybrid nanostructures 11a.

The light-absorbing layer 12 includes a light-absorbing material configured to absorb light of a particular (or, alternatively, predetermined) wavelength. The light-absorbing material may be one or more, and may be for example an organic material, an inorganic material, organic/inorganic material, or a combination thereof.

In some example embodiments, the light-absorbing layer 12 may include a near-infrared absorbing material configured to absorb light in at least a portion of a near-infrared wavelength spectrum. The near-infrared absorbing material may be configured to absorb light of at least a portion of a wavelength spectrum in a wavelength range (e.g., wavelength spectrum) of greater than about 700 nm and less than or equal to about 1200 nm. In some example embodiments, a maximum absorption wavelength ($\lambda_{max,A}$) of the near-infrared absorbing material may for example belong to (may be in) a wavelength range of about 750 nm to about 1100 nm, about 750 nm to about 1000 nm, about 800 nm to about 1000 nm, about 850 nm to about 990 nm, about 870 nm to about 990 nm, or about 890 nm to about 990 nm.

The near-infrared absorbing material may be one or two or more, and is not particularly limited as long as it is capable of selectively absorbing light in a near-infrared wavelength spectrum. The near-infrared absorbing material may be an organic material, an inorganic material, an organic/inorganic material, and/or a combination thereof.

The near-infrared absorbing material may include for example a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or a combination thereof, but is not limited thereto.

In some example embodiments, the light-absorbing layer 12 including the near-infrared absorbing material may have a (average) refractive index in a near-infrared wavelength spectrum of less than or equal to about 2.0 or less than or equal to about 1.8, for example about 1.1 to about 2.0 or about 1.1 to about 1.8, for example a (average) refractive index at a wavelength spectrum of about 900 nm to about 1000 nm (e.g., 940 nm) of less than or equal to about 2.0 or less than or equal to about 1.8, for example about 1.1 to about 2.0 or about 1.1 to about 1.8. In some example embodiments, the (average) absorption coefficient in the near-infrared wavelength spectrum of the light-absorbing layer 12 including the near-infrared absorbing material may be about 0.01 to about 0.5, for example the (average) absorption coefficient at a wavelength spectrum of about 900 nm to 1000 nm (e.g., 940 nm) may be about 0.01 to about 0.5.

The light-absorbing layer 12 may be formed from a composition including the aforementioned near-infrared absorbing material described above and may include for example a cured product of the composition.

The composition may optionally further include a binder in addition to the aforementioned near-infrared absorbing material. The binder may be for example an organic binder, an inorganic binder, an organic-inorganic binder, or a combination thereof. The binder is not particularly limited as long as it is a material capable of mixing with the near-infrared absorbing material, dispersing in the near-infrared absorbing material, or binding the near-infrared absorbing material. The binder may be a curable binder, for example a thermally curable binder, a photo-curable binder, or a combination thereof.

The binder may be for example a (meth)acryl binder, methyl cellulose, ethyl cellulose, hydroxypropyl methyl cellulose (HPMC), hydroxylpropyl cellulose (HPC), xanthan gum, polyvinyl alcohol (PVA), polyvinyl pyrrolidone (PVP), a cyclic olefin polymer (COP), carboxy methyl cellulose, hydroxyl ethyl cellulose, silicone, an organic-inorganic hybrid material, a copolymer thereof, or a combination thereof, but is not limited thereto.

The near-infrared absorbing material may be for example included in an amount of about 0.01 to about 50 parts by weight, about 0.01 to about 30 parts by weight, about 0.01 to about 20 parts by weight, about 0.01 to about 15 parts by weight, or about 0.01 to about 10 parts by weight based on 100 parts by weight of the binder.

The composition may optionally further include a solvent, in addition to the near-infrared absorbing material and binder.

The composition may be coated and dried on the base layer 13 and optionally cured. The coating may be for example a spin coating, a slit coating, a bar coating, a blade coating, a slot die coating, and/or an inkjet coating. The drying may be for example performed by natural drying, hot air drying, and/or a heat treatment at a higher temperature than the boiling point of the aforementioned solvent. The curing may be thermal curing, photo curing, or a combination thereof.

The light-absorbing layer 12 may have a thickness 12t ranging from about 1 nm to about 1000 nm, and within, the range, for example about 10 nm to about 1000 nm, about 10 nm to about 700 nm, about 10 nm to about 500 nm, or about 10 nm to about 300 nm.

The base layer 13 is disposed under the hybrid nanostructure array 11 and the light-absorbing layer 12 and may support the hybrid nanostructure array 11 and the light-absorbing layer 12. The base layer 13 may be a transparent base layer and, in some example embodiments, may have transmittance of greater than or equal to about 85%, greater than or equal to about 88%, greater than or equal to about 90%, or greater than or equal to about 92% in a wavelength spectrum of about 400 nm to about 1000 nm.

The base layer 13 may have, in some example embodiments a (average) refractive index of less than or equal to about 1.7, in some example embodiments a (average) refractive index of about 1.4 to 1.7 in a range of about 900 nm to about 1000 nm (e.g., 940 nm). The base layer 13 may, in some example embodiments, include an organic material, an inorganic material, an organic/inorganic material, or a combination thereof, in some example embodiments, an oxide, a nitride, a sulfide, a fluoride, a polymer, or a combination thereof, in some example embodiments, glass, a silicon oxide, an aluminum oxide, a magnesium fluoride, polystyrene, polymethylmethacrylate, polycarbonate, or a combination thereof, but is not limited thereto.

The combination structure 10 may have a thickness 10t of less than or equal to about 10 μm, less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm. In some example embodiments, the thickness 10t of combination structure 10 may be in a range of about 100 nm to about 10 μm, about 100 nm to about 5 μm, about 100 nm to about 3 μm, about 100 nm to about 2 μm, about 100 nm to about 1 μm, about 100 nm to about 900 nm, about 100 nm to about 800 nm, about 100 nm to about 700 nm, about 100 nm to about 600 nm, or about 100 nm to about 500 nm.

The combination structure 10 may exhibit high light absorption characteristics at a thin thickness 10t by combining the hybrid nanostructure array 11 and the light-absorbing layer 12. This is based on unique optical properties of the combination of the hybrid nanostructure array 11 and/or the hybrid nanostructures 11a and the light-absorbing layer 12. The hybrid nanostructure array 11 and/or the hybrid nanostructures 11a may be configured to confine incident light of a particular (or, alternatively, predetermined) wavelength and the incident light confined in the hybrid nanostructure array 11 and/or the hybrid nanostructures 11a may be configured to multi-absorbed in the adjacent light-absorbing layer 12 by an evanescent wave and thus exhibit a high absorption effect. An absorbed light amount by the multi-absorption may be greatly higher compared with an absorbed light amount in a structure without a hybrid nanostructure array 11, in which incident light from a planar structure (without a hybrid nanostructure array 11) once passes the light-absorbing layer 12.

In addition, the hybrid nanostructures 11a include a stack of at least one first nanostructure 11a-1 and at least one second nanostructure 11a-2 having different refractive indices as described above, and thereby may increase a transmittance of light in a visible wavelength spectrum compared with structures including the first nanostructure 11a-1 alone or the second nanostructure 11a-2 alone. As a result, the combination structure 10 may increase the transmittance of light in the visible wavelength spectrum and the absorbance of the near-infrared wavelength spectrum and thus further increase a selective blocking effect for the near-infrared wavelength spectrum.

An optical spectrum of the combination structure 10 may have a maximum absorption wavelength ($\lambda_{max,A}$) and a minimum transmission wavelength ($\lambda_{min,T}$) in a wavelength range of greater than about 700 nm and less than or equal to about 1200 nm, and within the range, for example a maximum absorption wavelength ($\lambda_{max,A}$) and a minimum transmission wavelength ($\lambda_{min,T}$) in about 750 nm to about 1100 nm, about 750 nm to about 1000 nm, about 800 nm to about 1000 nm, about 850 nm to about 990 nm, about 870 nm to about 990 nm, or about 890 nm to about 990 nm.

An absorbance of the combination structure 10 at the maximum absorption wavelength ($\lambda_{max,A}$) may be greater than or equal to about 50%, and within the range, for example greater than or equal to about 55%, greater than or equal to about 60%, greater than or equal to about 65%, or greater than or equal to about 70%.

A transmittance of the combination structure 10 at the maximum absorption wavelength ($\lambda_{max,A}$) may be less than or equal to about 50%, and within the range, for example less than or equal to about 45%, less than or equal to about 40%, less than or equal to about 35%, less than or equal to about 32%, less than or equal to about 30%, less than or equal to about 28%, less than or equal to about 25%, less than or equal to about 22%, less than or equal to about 20%, less than or equal to about 18%, less than or equal to about 15%, less than or equal to about 10%, or less than or equal to about 5%.

A reflectance of the combination structure 10 at the maximum absorption wavelength ($\lambda_{max,A}$) may be less than about 40%, and within the range, less than or equal to about 35%, less than or equal to about 30%, less than or equal to about 25%, less than or equal to about 20%, less than or equal to about 15%, or less than or equal to about 10%.

An average transmittance of the combination structure 10 in a near-infrared wavelength spectrum may be less than or equal to about 50%, within the range less than or equal to about 48%, less than or equal to about 45%, less than or equal to about 40%, less than or equal to about 35%, less than or equal to about 30%, less than or equal to about 25%, less than or equal to about 20%, less than or equal to about 15%, or less than or equal to about 10%. Herein, the near-infrared wavelength spectrum may be in the range of greater than about 700 nm and less than or equal to about 1200 nm, about 750 nm to about 1100 nm, about 750 nm to about 1000 nm, about 800 nm to about 1000 nm, about 850 nm to about 990 nm, about 870 nm to about 990 nm, or about 890 nm to about 990 nm.

An average transmittance of the combination structure 10 in a visible wavelength spectrum may be greater than or equal to about 50%, and within the range, greater than or equal to about 55%, greater than or equal to about 60%, greater than or equal to about 65%, greater than or equal to about 70%, greater than or equal to about 75%, or greater than or equal to about 80%. Herein, the visible wavelength spectrum may be about 400 nm to about 700 nm or about 430 to about 565 nm.

Hereinafter, a combination structure according to some example embodiments is described.

Figure 7:
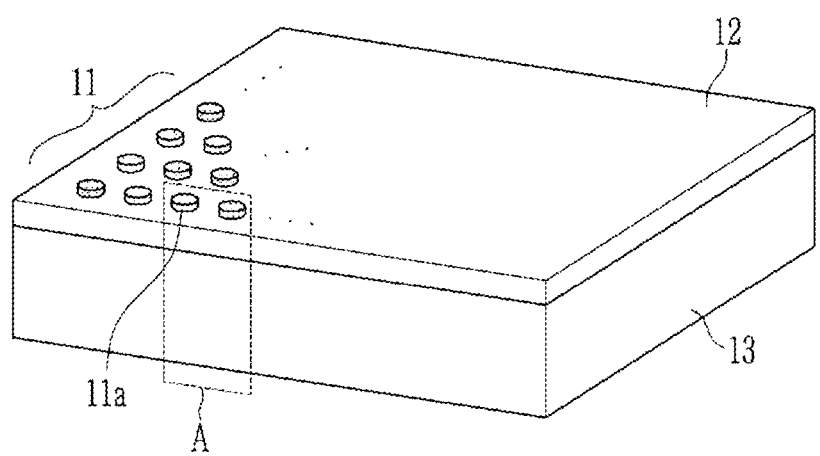
FIG. 7 is a schematic view showing another example of a combination structure according to some example embodiments.
Figure 8:
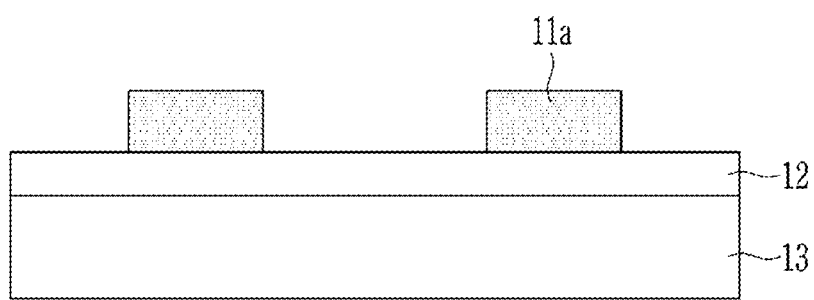
FIG. 8 is a cross-sectional view showing an enlarged portion A of the combination structure shown in FIG. 7.

FIG. 7 is a schematic view showing another example of a combination structure according to some example embodiments, and FIG. 8 is a cross-sectional view showing an enlarged portion A of the combination structure shown in FIG. 7.

According to some example embodiments, including the example embodiments illustrated in FIGS. 7-8, a combination structure 10 includes hybrid nanostructure array 11 including a plurality of hybrid nanostructures 11a; a light-absorbing layer 12; and a base layer 13, like some example embodiments, including the example embodiments illustrated in at least FIGS. 1-2.

However, in the combination structure 10 according to some example embodiments, including the example embodiments illustrated in FIGS. 7-8, unlike some example embodiments, including the example embodiments illustrated in at least FIGS. 1-2, the light-absorbing layer 12 may be in contact with the lower surface of the hybrid nanostructures 11a.

Figure 9:
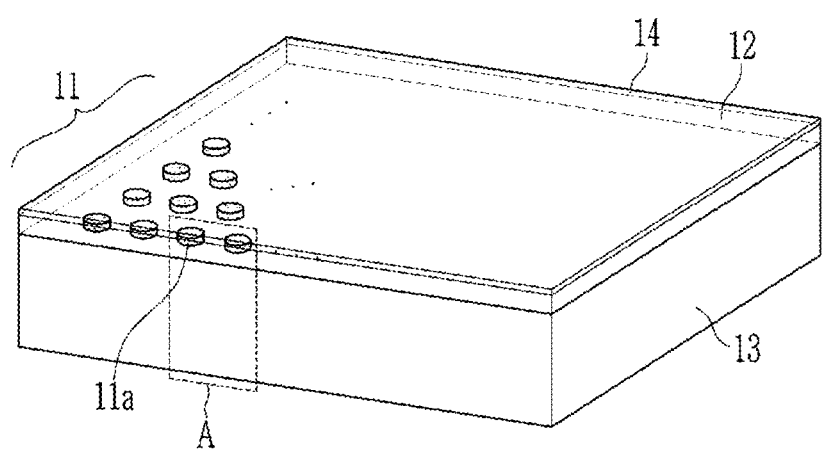
FIG. 9 is a schematic view showing another example of a combination structure according to some example embodiments.
Figure 10:
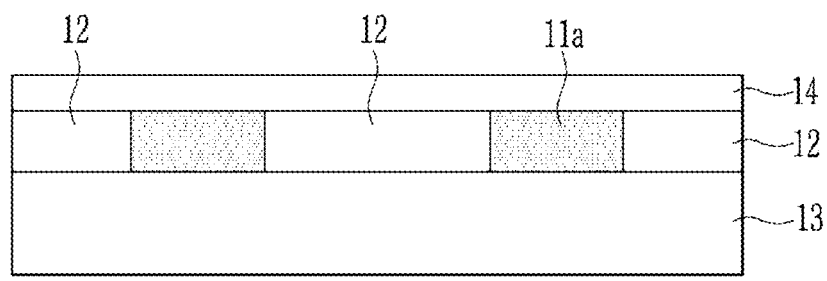
FIG. 10 is a cross-sectional view showing an enlarged portion A of the combination structure shown in FIG. 9.

FIG. 9 is a schematic view showing another example of a combination structure according to some example embodiments and FIG. 10 is a cross-sectional view showing an enlarged portion A of the combination structure shown in FIG. 9.

According to some example embodiments, including the example embodiments illustrated in FIGS. 9-10, a combination structure 10 includes a hybrid nanostructure array 11 including a plurality of hybrid nanostructures 11a; a light-absorbing layer 12; and a base layer 13, like some example embodiments, including the example embodiments illustrated in at least FIGS. 7-8.

However, in the combination structure 10 according to some example embodiments, including the example embodiments illustrated in FIGS. 9-10, unlike some example embodiments, including the example embodiments illustrated in at least FIGS. 7-8, the light-absorbing layer 12 may be in contact with the side surfaces of the hybrid nanostructures 11a.

In addition, according to some example embodiments, including the example embodiments illustrated in FIGS. 9-10, a combination structure 10 further includes a protective layer 14 on the hybrid nanostructure array 11 and the light-absorbing layer 12, unlike some example embodiments, including the example embodiments illustrated in at least FIGS. 1-2 and 7-8. The protective layer 14 may include an organic material, an inorganic material, an organic/inorganic material, or a combination thereof, for example, an oxide, a nitride, a fluoride, a polymer, or a combination thereof, for example glass, silicon oxide, magnesium fluoride, polystyrene, polymethylmethacrylate, polycarbonate, or a combination thereof, but is not limited thereto. The protective layer 14 may be omitted as desired.

Figure 11:
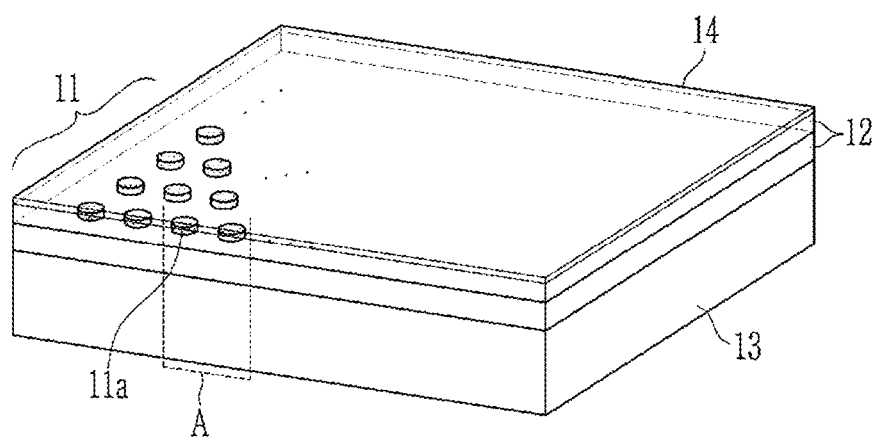
FIG. 11 is a schematic view showing another example of a combination structure according to some example embodiments.
Figure 12:
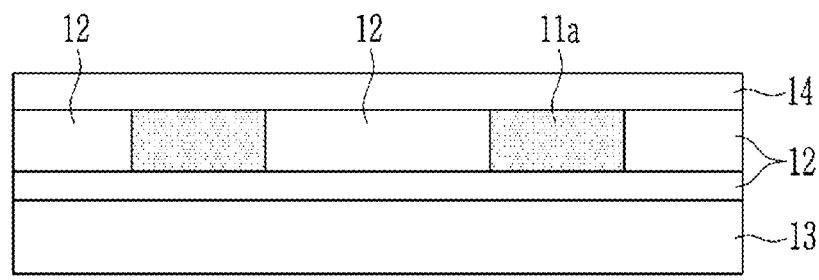
FIG. 12 is a cross-sectional view showing an enlarged portion A of the combination structure shown in FIG. 11.

FIG. 11 is a schematic view showing another example of a combination structure according to some example embodiments and FIG. 12 is a cross-sectional view showing an enlarged portion A of the combination structure shown in FIG. 11.

According to some example embodiments, including the example embodiments illustrated in FIGS. 11-12, a combination structure 10 includes a hybrid nanostructure array 11 including a plurality of hybrid nanostructures 11a; a light-absorbing layer 12; a base layer 13; and optionally a protective layer 14, like some example embodiments, including the example embodiments illustrated in FIGS. 9-10.

However, in the combination structure 10 according to some example embodiments, including the example embodiments illustrated in FIGS. 11-12, the light-absorbing layer 12 may be disposed on each of one or more side surfaces and one or more lower surfaces of the hybrid nanostructure array 11. In some example embodiments, including the example embodiments illustrated in FIGS. 11-12, the light-absorbing layer 12 may be in contact with the one or more side surfaces and one or more lower surfaces of the plurality of hybrid nanostructures 11a, unlike some example embodiments, including the example embodiments illustrated in FIGS. 9-10.

The aforementioned combination structure 10 may exhibit high light absorption characteristics at a thin thickness 10t by increasing absorption of light of a desired wavelength, thereby realizing a thin-thickness optical filter. In some example embodiments, the combination structure 10 designed to selectively absorb light in a near-infrared wavelength spectrum may be configured to effectively transmit light in the visible wavelength spectrum and selectively absorb light in a near-infrared wavelength spectrum, and thus it may be effectively applied as an optical filter to block light in near-infrared wavelength spectrum in the light sensing sensor such as an image sensor. In addition, the combination structure 10 may exhibit sufficient light absorption characteristics at a thin thickness 10t as described above, and thus may be integrated into a sensor such as an image sensor to implement an internal optical filter.

The combination structure 10 may be applied to all applications for filtering light of a particular (or, alternatively, predetermined) wavelength spectrum as an optical filter, and may be effectively applied as a near-infrared cut filter configured to filter light in a near-infrared wavelength spectrum. The optical filter may be usefully applied to an electronic device including for example an image sensor, a camera module, and the like. The electronic device may be a digital camera, a camcorder, a monitoring camera such as CCTV, an in-car camera, a robot camera, a medical camera, a cell phone having a built-in or external camera, a computer having a built-in or external camera, a laptop computer having a built-in or external camera, any combination thereof, or the like but is not limited thereto.

Hereinafter, an example of a camera module provided with the aforementioned combination structure 10 is described.

Figure 13:
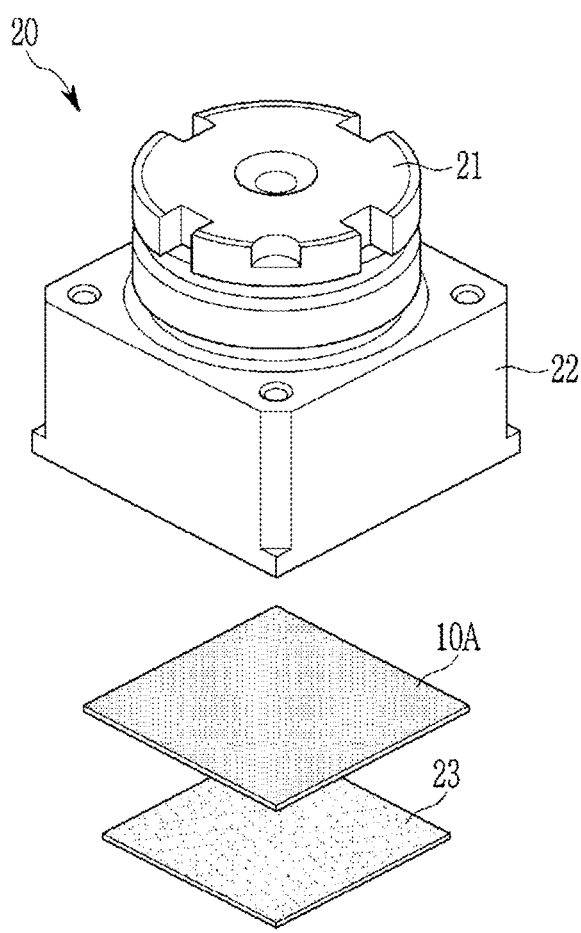
FIG. 13 is a schematic view showing an example of a camera module according to some example embodiments.

FIG. 13 is a schematic view showing an example of a camera module according to some example embodiments.

Referring to FIG. 13, a camera module 20, also referred to herein as simply a "camera," includes a lens barrel 21, a housing 22, an optical filter 10A, and an image sensor 23. In some example embodiments, the lens barrel 21 and/or the housing 22 may be omitted.

The lens barrel 21 includes at least one lens imaging a subject, and the lens may be disposed along an optical axis direction. Herein, the optical axis direction may be a vertical direction of the lens barrel 21. The lens barrel 21 is internally housed in the housing 22 and united with the housing 22. The lens barrel 21 may be moved in optical axis direction inside the housing 22 for autofocusing.

The housing 22 supports and houses the lens barrel 21 and the housing 22 may be open in the optical axis direction. Accordingly, incident light from one surface of the housing 22 may reach the image sensor 23 through the lens barrel 21 and the optical filter 10A.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device except for the actuator may be adopted.

The optical filter 10A may include the aforementioned combination structure 10 and the combination structure 10 is the same as described above.

The image sensor 23 may collect an image of a subject and thus store the image as data, and the stored data may be displayed as an image through a display media.

The image sensor 23 may be mounted in a substrate (not shown) and electrically connected to the substrate. The substrate may be, in some example embodiments, a printed circuit board (PCB) or electrically connected to a printed circuit board, and the printed circuit may be, in some example embodiments, a flexible printed circuit (FPCB).

The image sensor 23 concentrates light passing the lens barrel 21 and the optical filter 10A and generates a video signal and may be a complementary metal-oxide semiconductor (CMOS) image sensor and/or a charge coupled device (CCD) image sensor.

Figure 14:
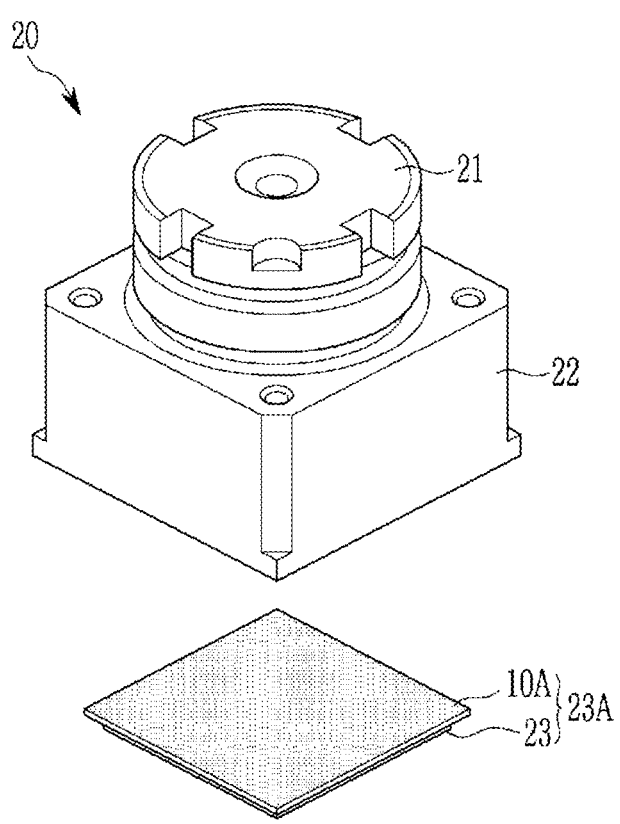
FIG. 14 is a schematic view showing another example of a camera module according to some example embodiments.

FIG. 14 is a schematic view showing another example of a camera module according to some example embodiments.

Referring to FIG. 14, a camera module 20 according to some example embodiments includes the lens barrel 21, the housing 22, the optical filter 10A, and the image sensor 23, like some example embodiments, including the example embodiments illustrated in FIG. 13.

However, in the camera module 20 according to some example embodiments, including the example embodiments illustrated in FIG. 14, the optical filter 10A and the image sensor 23 may be in contact with each other, for example the optical filter 10A and the image sensor 23 may be integrally provided to realize an integrated image sensor 23A, unlike some example embodiments, including the example embodiments illustrated in FIG. 13.

Hereinafter, an example of an optical filter-integrated image sensor will be described with reference to a drawing. As an example of an image sensor, a CMOS image sensor is described.

Figure 15:
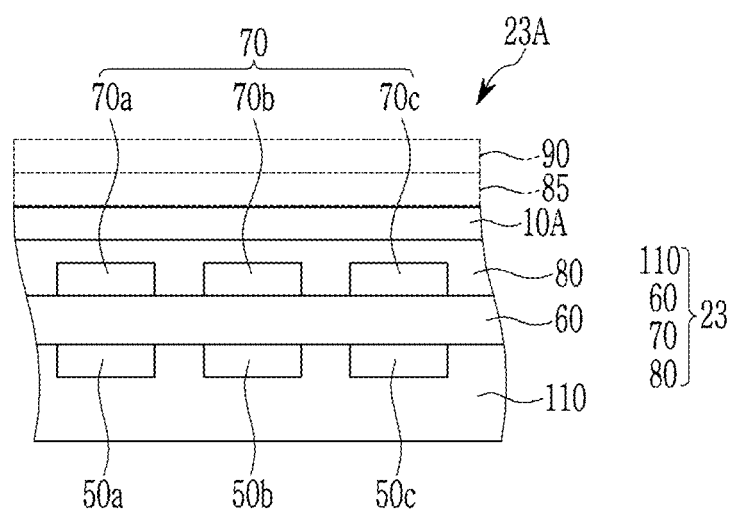
FIG. 15 is a cross-sectional view showing an example of an image sensor according to some example embodiments.

FIG. 15 is a cross-sectional view showing an example of an image sensor according to some example embodiments.

An integrated image sensor 23A according to some example embodiments includes an image sensor 23 including a semiconductor substrate 110, a lower insulation layer 60, a color filter layer 70 and an upper insulation layer 80, and an optical filter 10A.

The semiconductor substrate 110 may be a silicon substrate, and is integrated with the photo-sensing devices 50a, 50b, and 50c, and transmission transistor (not shown). The photo-sensing devices 50a, 50b, and 50c may be photodiodes (e.g., a plurality of photodiodes) and may be understood to be included at least partially within the semiconductor substrate 110. In some example embodiments, the photo-sensing device 50a may be a blue photo-sensing device 50a configured to sense light in a blue wavelength spectrum which passes a blue filter 70a described later, the photo-sensing device 50b may be a green photo-sensing device 50b configured to sense light in a green wavelength spectrum which passes a green filter 70b described later, and the photo-sensing device 50c may be a red photo-sensing device 50c configured to sense light in a red wavelength spectrum passes a red filter 70c described later. The photo-sensing devices 50a, 50b, and 50c and the transmission transistor may be integrated in each pixel. The photo-sensing devices 50a, 50b, and 50c sense light and the sensed information may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but is not limited thereto. However, it is not limited to the structure, and the metal wire and pad may be disposed under the photo-sensing devices 50a, 50b, and 50c.

It will be understood that an element that is described herein as being "on" another element may be above or beneath the other element. Additionally, it will be understood that an element that is described herein as being "on" another element may be "directly" on the other element such that the element is in contact with the other element or may be "indirectly" on the other element such that the element is isolated from contact with the other element by one or more interposing structures and/or spaces.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a blue filter 70a formed in a blue pixel, a green filter 70b formed in a green pixel, and a red filter 70c formed in a red pixel. However, the present disclosure is not limited thereto, but at least one of the blue filter 70a, the green filter 70b, or the red filter 70c may be replaced by a yellow filter, a cyan filter, or a magenta filter.

The upper insulation layer 80 is formed on the color filter layer 70. The upper insulation layer 80 may provide a flat surface by reducing stepped portions formed by the color filter layer 70. The upper insulation layer 80 may be made of an inorganic insulating material such as silicon oxide and/or silicon nitride or an organic insulating material. The upper insulation layer 80 may be omitted as needed.

The optical filter 10A is formed on the upper insulation layer 80 and thus may be understood to be on (e.g., indirectly on) the semiconductor substrate 110. The optical filter 10A may be the aforementioned combination structure 10. As described above, the optical filter 10A may include a hybrid nanostructure array 11 including a plurality of hybrid nanostructures 11a; a light-absorbing layer 12; and a base layer 13, and may for example effectively transmit light in a visible wavelength spectrum and effectively block light in the other regions than a visible region, like a near-infrared wavelength spectrum. When the aforementioned upper insulation layer 80 is the same as the base layer 13 of the combination structure 10, any one of the upper insulation layer 80 or the base layer 13 may be omitted. Detailed descriptions of the combination structure 10 are as described above.

Focusing lens 85 may be further formed on the optical filter 10A. However, the present disclosure is not limited thereto, and the optical filter 10A may be disposed on the focusing lens. The focusing lens may control a direction of incident light and gather the light in one region. The focusing lens may have a shape of, in some example embodiments, a cylinder or a hemisphere, but is not limited thereto.

A dual bandpass filter 90 may be disposed on the focusing lens 85. The dual bandpass filter may selectively transmit light in at least two wavelength spectra of incident light and may for example selectively transmit light in a visible wavelength spectrum and in a near-infrared wavelength spectrum. For example, the dual bandpass filter 90 may be configured to selectively transmit light of an entirety of the visible wavelength spectrum and a portion (e.g., a limited portion) of the near-infrared wavelength spectrum.

As described above, the optical filter 10A may be configured to effectively transmit light in the visible region and effectively absorb and block light in the regions except for the visible region, like the near-infrared region, and thus transfer pure light in the visible region to the image sensor and accordingly, reduce or prevent a crosstalk generated when a signal by light of the visible region is crossed and mingled with another signal by light of a non-visible region and particularly, the near-infrared wavelength spectrum. Restated, the optical filter 10A may be configured to block light of at least a portion of a near-infrared wavelength spectrum. For example, the optical filter 10A may be configured to block said light of at least a portion of a near-infrared wavelength spectrum, of light that is incident on a surface of the optical filter 10A that is distal from the semiconductor substrate 110, from passing through the optical filter 10A to be incident on one or more portions and/or surfaces of some or all of the image sensor 23.

Particularly, the optical filter 10A may have a thin thickness of less than or equal to about 10 μm, less than or equal to about 5 μm, less than or equal to about 3 μm, less than or equal to about 2 μm, less than or equal to about 1 μm, or less than or equal to about 700 nm, and thus the optical filter 10A and the image sensor 23 may be realized into an integrated image sensor 23A, and accordingly, may realize thinness of an image sensor, a camera module, and an electronic device equipped therewith.

Figure 16:
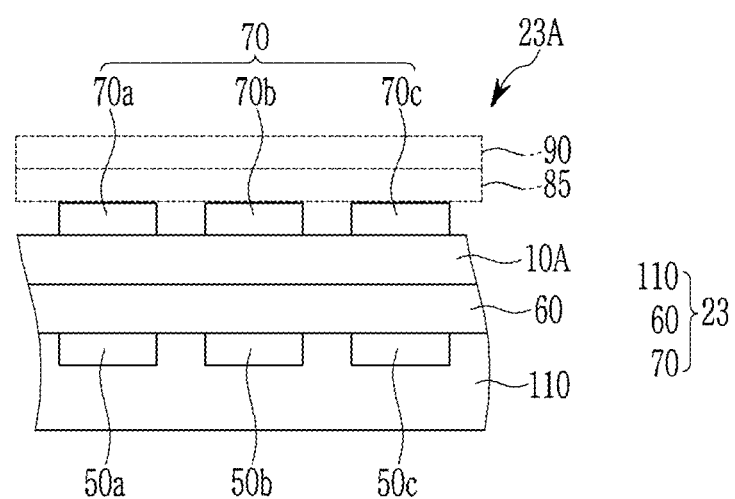
FIG. 16 is a cross-sectional view showing another example of an image sensor according to some example embodiments.

FIG. 16 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, and 50c, the lower insulation layer 60, and the color filter layer 70; and the optical filter 10A, like some example embodiments.

However, according to some example embodiments, including the example embodiments illustrated in FIG. 16, in the integrated image sensor 23A, the optical filter 10A is disposed under (e.g., beneath) the color filter layer 70, unlike the example embodiments illustrated in FIG. 15. Accordingly, as shown in FIGS. 15-16, in some example embodiments an image sensor 23A may include a color filter layer 70, which may include one or more color filters 70a, 70b, or 70c, which may be on (e.g., indirectly on) the semiconductor substrate 110 and may be above (e.g., as shown in FIG. 16) or beneath (e.g., as shown in FIG. 15) the optical filter 10A. In the drawing, the optical filter 10A is illustrated as an example with a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Figure 17:
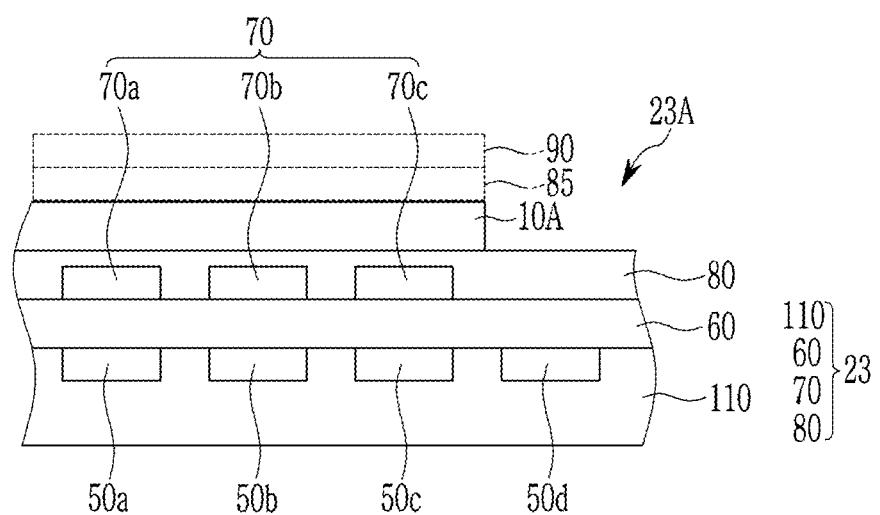
FIG. 17 is a cross-sectional view showing another example of an image sensor according to some example embodiments.

FIG. 17 is a cross-sectional view showing another example of an image sensor according to some example embodiments.

According to some example embodiments, an integrated image sensor 23A includes an image sensor 23 including the semiconductor substrate 110 integrated with photo-sensing device 50a, 50b, and 50c, the lower insulation layer 60, the color filter layer 70, and the upper insulation layer 80, and the optical filter 10A, like some example embodiments.

However, according to some example embodiments, the integrated image sensor 23A may include the photo-sensing device 50d for sensing light belonging to the infrared wavelength spectrum additionally integrated in the semiconductor substrate 110 unlike some example embodiments. The color filter layer 70 may include a transparent filter or a white color filter (not shown) at the position corresponding to the photo-sensing device 50d or may be an empty space without a particular filter.

The optical filter 10A may be disposed only either on the upper or lower surface of the blue filter 70a, the green filter 70b, and the red filter 70c but neither on the upper nor lower surface of the transparent filter or the white color filter.

The dual bandpass filter 90 may for example selectively transmit light in a visible wavelength spectrum and in a near-infrared wavelength spectrum.

In some example embodiments, the photo-sensing device 50d may be used as an auxiliary device for telephoto cameras to improve the sensitivity of the image sensor in low-illumination environments.

In some example embodiments, the photo-sensing device 50d may be used as an infrared sensor configured to sense light in a near-infrared wavelength spectrum. The infrared sensor may extend a dynamic range specifically classifying a black/white contrast and thus increase sensing capability of a 3-dimensional image. The infrared sensor may be for example a biometric sensor, for example an iris sensor, a depth sensor, a fingerprint sensor, a blood vessel distribution sensor, but is not limited thereto.

Figure 18:
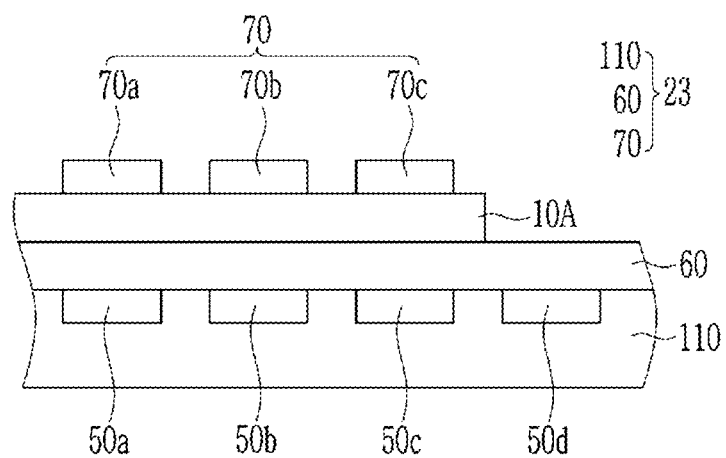
FIG. 18 is a cross-sectional view illustrating an example of an image sensor according to some example embodiments.

FIG. 18 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, 50c, and 50d, the lower insulation layer 60, and the color filter layer 70 (e.g., including color filters 70a, 70b, and 70c corresponding to, and vertically overlapping, respective photo-sensing devices 50*a*, 50*b*, 50*c*, and 50*d*); and the optical filter 10A, like some example embodiments.

However, according to some example embodiments, in the integrated image sensor 23A, the optical filter 10A is disposed under the color filter layer 70, unlike some example embodiments. In the drawing, the optical filter 10A is illustrated as an example with a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Hereinafter, some example embodiments are illustrated in more detail with reference to examples. However, the present scope of the inventive concepts is not limited to these examples.

Manufacture of Near-Infrared Absorption Film

Preparation Example 1

A near-infrared absorbing material (Epolight™ 1178, Epolin) and a cyclo olefin polymer (poly[[octahydro-5-(methoxycarbonyl)-5-methyl-4,7-methano-1H-indene-1,3-diyl]-1,2-ethanediyl], CAS No. 123322-60-1, Sigma-Aldrich Co., Ltd.) are mixed in chloroform to prepare a composition. Herein, the near-infrared absorbing material and the cyclo olefin polymer are used in a weight ratio of 0.3:9.7 and at a concentration of 6.5 wt % in the composition. Subsequently, the composition is spin-coated (3000 rpm, 20 seconds) on a SiO$_2$ base layer and then, dried to form an about 800 nm-thick film.

Preparation Example 2

A film is formed according to the same method as Preparation Example 1 except that the weight ratio of the near-infrared absorption compound and the cyclo olefin polymer are changed into 0.5:9.5.

Preparation Example 3

A film is formed according to the same method as Preparation Example 1 except that the weight ratio of the near-infrared absorption compound and the cyclo olefin polymer are changed into 1:9.

Preparation Example 4

A film is formed according to the same method as Preparation Example 1 except that the weight ratio of the near-infrared absorption compound and the cyclo olefin polymer are changed into 2:8.

Evaluation of Properties of Near-Infrared Absorption Film

Properties of the films of Preparation Examples 1 to 4 are examined.

Transmittance and absorbance are measured by using a UV-VIS-NIR spectrophotometer (SolidSpec-3700 DUV, Shimadzu Scientific Instruments), and a film thickness is measured by using Alpha-Step (D-500 Stylus Profiler, KLA). The transmittance and the film thickness are used to obtain an absorption coefficient according to Relationship Equation.

$$T(\lambda)=\exp(-\alpha(\lambda)d)=\exp(-4\pi/\lambda \times k(\lambda)d) \quad \text{[Relationship Equation]}$$

In Relationship Equation, T(λ) indicates transmittance depending on a wavelength, λ indicates a wavelength (unit: nm), k(λ) indicates an absorption coefficient depending on a wavelength, and d indicates a film thickness (unit: nm).

A refractive index and an absorption coefficient are measured from a polarized light characteristic change (Delta, Psi) by using Ellipsometry equipment (J. A. Woollam Co.). Herein, the absorption coefficient obtained from Ellipsometry is compared with the absorption coefficient obtained to Relationship Equation to determine whether or not they coincide each other.

A maximum absorption wavelength ($\lambda_{max,A}$) is measured by using a UV-VIS-NIR spectrophotometer (SolidSpec-3700 DUV, Shimadzu Scientific Instruments).

The results are shown in Table 1.

TABLE 1

|  | Average Refractive Index (n) (@900-1000 nm) | Average Absorption Coefficient (k) (@900-1000 nm) | Maximum Absorption Wavelength ($\lambda_{max \cdot A}$) (nm) |
| --- | --- | --- | --- |
| Preparation Example 1 | 1.49 | 0.03 | 970 |
| Preparation Example 2 | 1.49 | 0.06 | 970 |
| Preparation Example 3 | 1.48 | 0.11 | 970 |
| Preparation Example 4 | 1.49 | 0.22 | 942 |

* n, k: an average value in a wavelength spectrum of about 900 nm to about 1000 nm Design and Evaluation of Combination Structure I Based on the properties of the films, an optical simulation with respect to combination structures is performed by using a FDTD (Finite-different time domain, Lumerical Inc.).

Example 1

A structure of disposing light-absorbing layer and a hybrid nanostructure array on a SiO$_2$ base layer is designed. The hybrid nanostructure array includes a hybrid nanostructure of stacking one first nanostructure (Au) and one second nanostructure (TiO$_2$) (shown in FIGS. 1 to 3).
  (1) Base layer
  SiO$_2$ base layer
  (2) Light-absorbing layer
  Properties of the film according to Preparation Example 1
  Thickness: 160 nm
  (3) Hybrid nanostructure array
  First nanostructure: gold (Au)
  Thickness of the first nanostructure: 10 nm
  Second nanostructure: titanium oxide (TiO$_2$)
  Thickness of the Second nanostructure: 100 nm
  Shape: cylinder
  Shape of cross-section: rectangular shape
  Diameter: 140 nm
  Period: 440 nm
  Gap: 300 nm Examples 2 to 4 and Comparative Examples 1 to 4

Structures are designed according to the same method as Example 1 except that dimensions of the hybrid nanostructures and the light-absorbing layers are changed as shown in Table 2. However, Comparative Example 4 uses properties of the film according to Preparation Example 2.

TABLE 2

| | Hybrid Nano-structure Array | | Thickness (nm) | | |
|---|---|---|---|---|---|
| | Diameter (r) (nm) | Gap (nm) | First Nano-structure (Au) | Second Nano-structure (TiO$_2$) | Light-absorbing Layer |
| Example 1 | 140 | 300 | 10 | 100 | 160 |
| Example 2 | 180 | 260 | 30 | 100 | 180 |
| Example 3 | 140 | 300 | 10 | 150 | 210 |
| Example 4 | 140 | 300 | 10 | 200 | 260 |
| Comparative Example 1 | 140 | 300 | 0 | 100 | 0 |
| Comparative Example 2 | 180 | 260 | 10 | 100 | 0 |
| Comparative Example 3 | 140 | 300 | 0 | 100 | 150 |
| Comparative Example 4 | 420 | 160 | 0 | 250 | 250 |

Evaluation I

Optical properties of the structures according to Examples 1 to 4 and Comparative Examples 1 to 4 are evaluated.

The results are shown in Table 3 and FIGS. 19 to 26.

Figure 19:
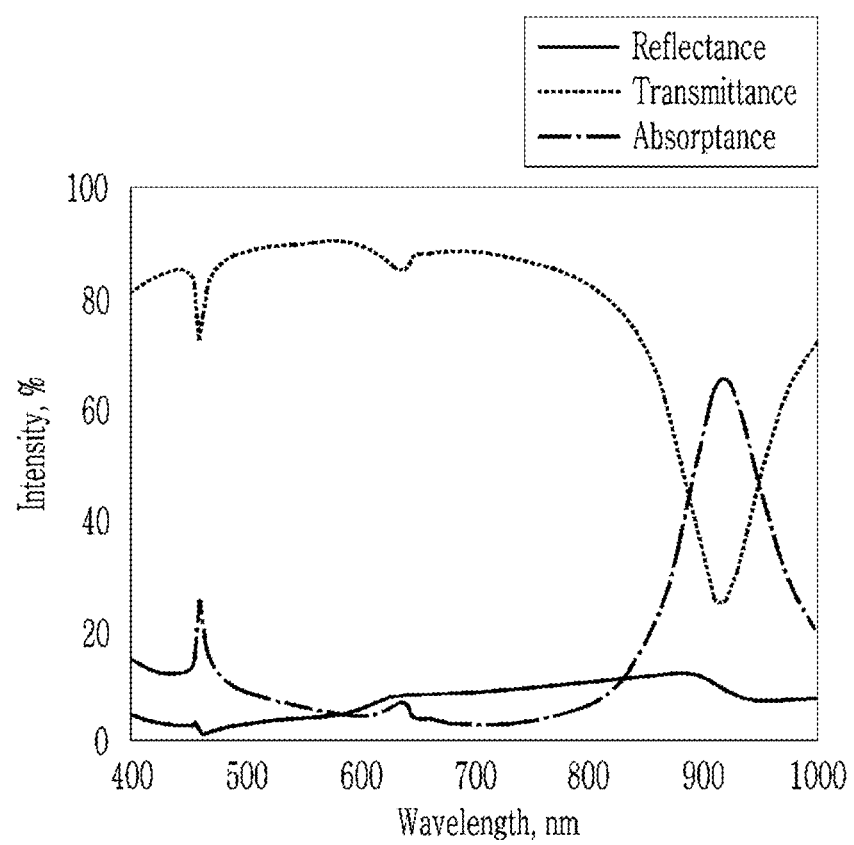
FIG. 19 is a graph showing an optical spectrum of the structure according to Example 1.
Figure 20:
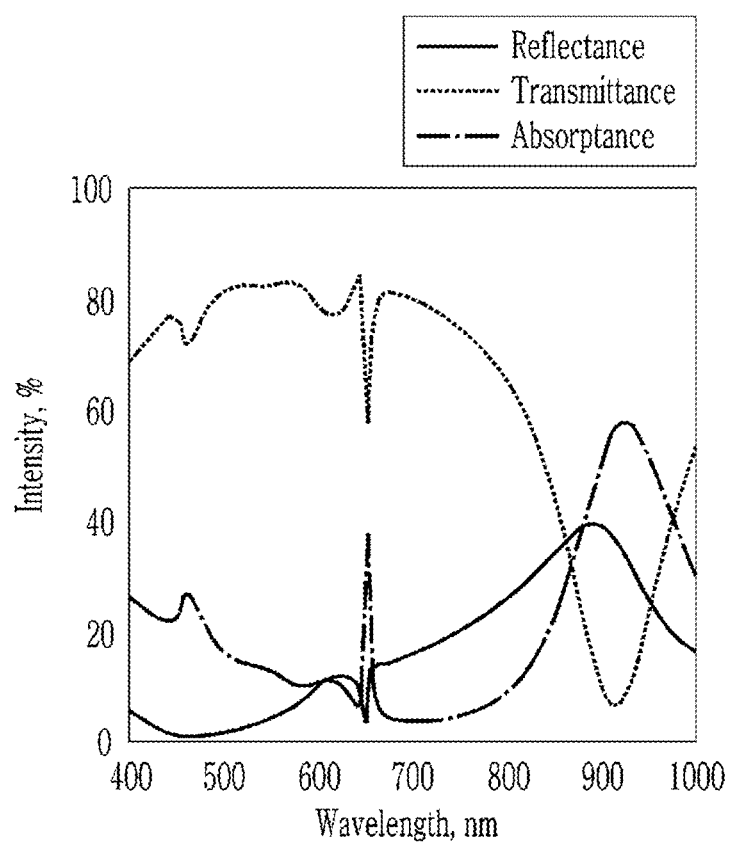
FIG. 20 is a graph showing an optical spectrum of the structure according to Example 2.
Figure 21:
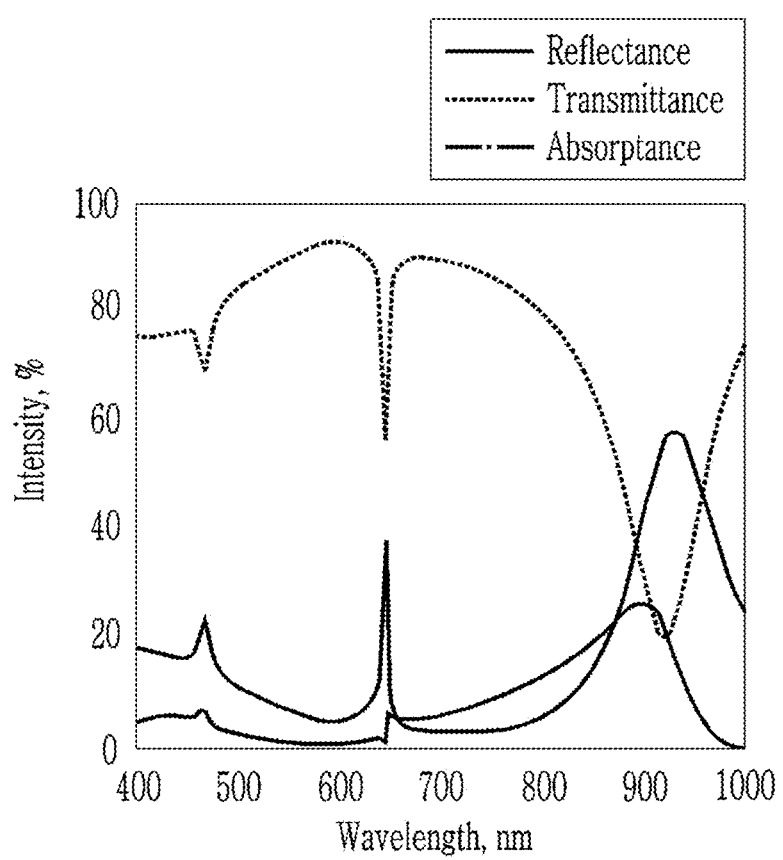
FIG. 21 is a graph showing an optical spectrum of the structure according to Example 3.
Figure 22:
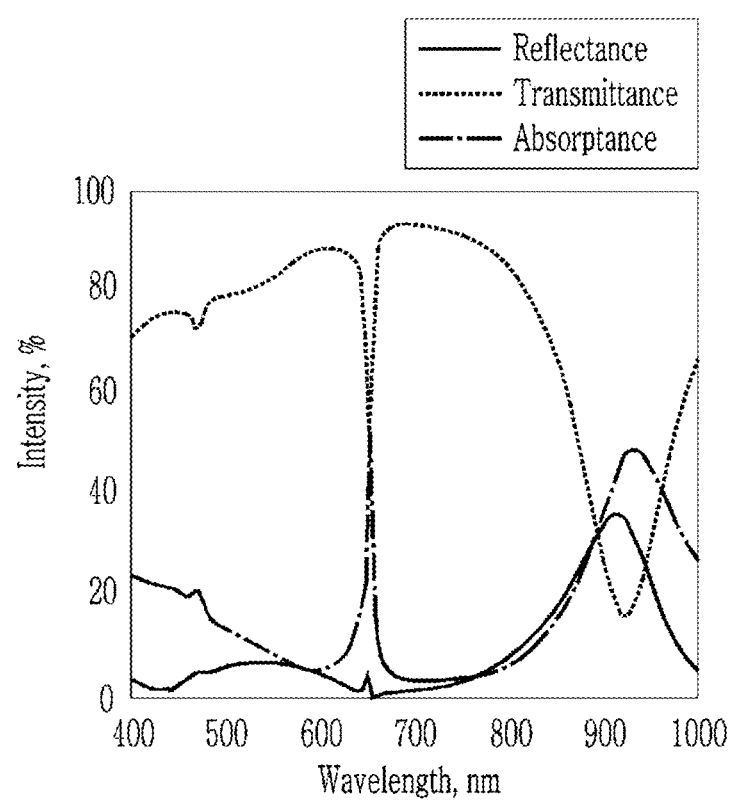
FIG. 22 is a graph showing an optical spectrum of the structure according to Example 4.
Figure 23:
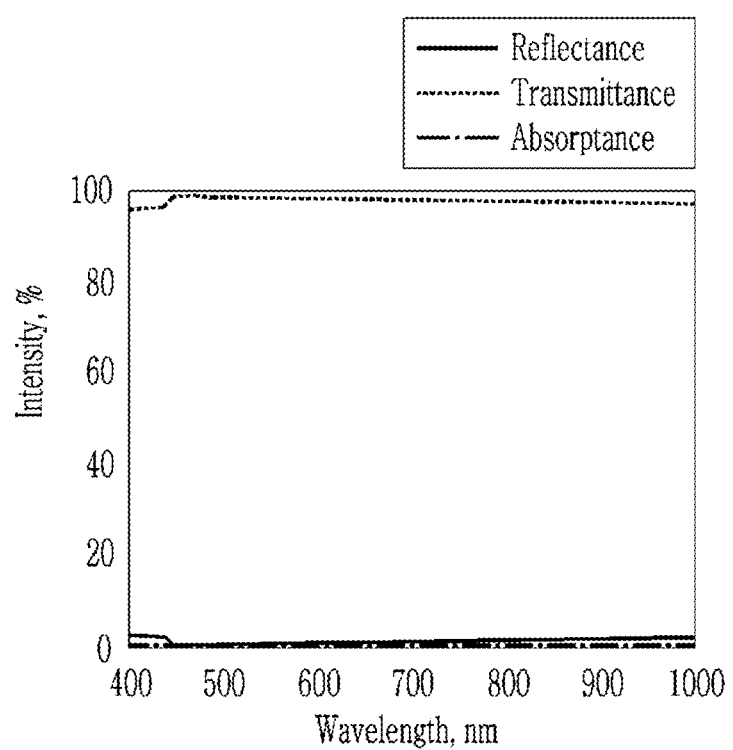
FIG. 23 is a graph showing an optical spectrum of the structure according to Comparative Example 1.
Figure 24:
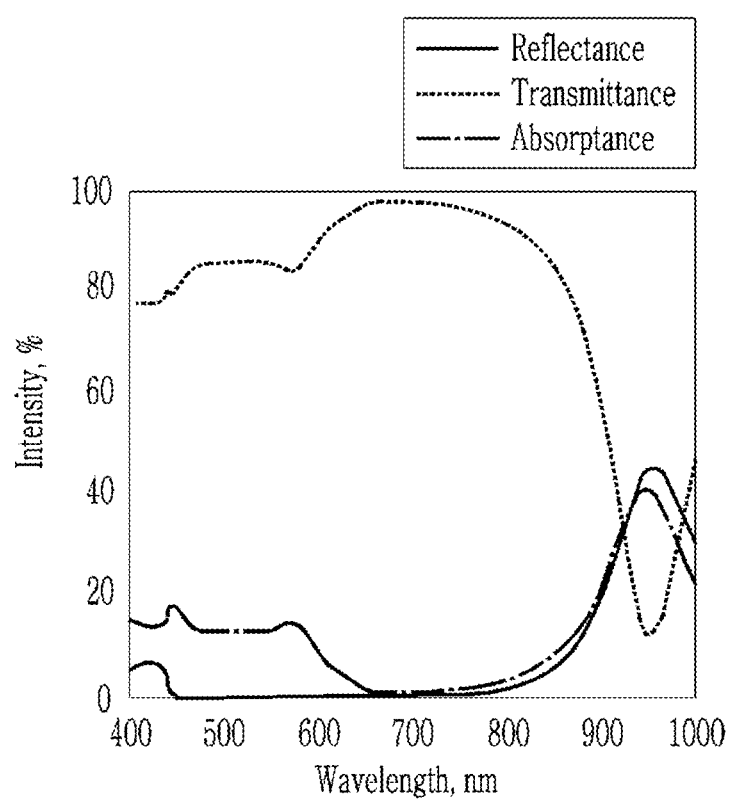
FIG. 24 is a graph showing an optical spectrum of the structure according to Comparative Example 2.
Figure 25:
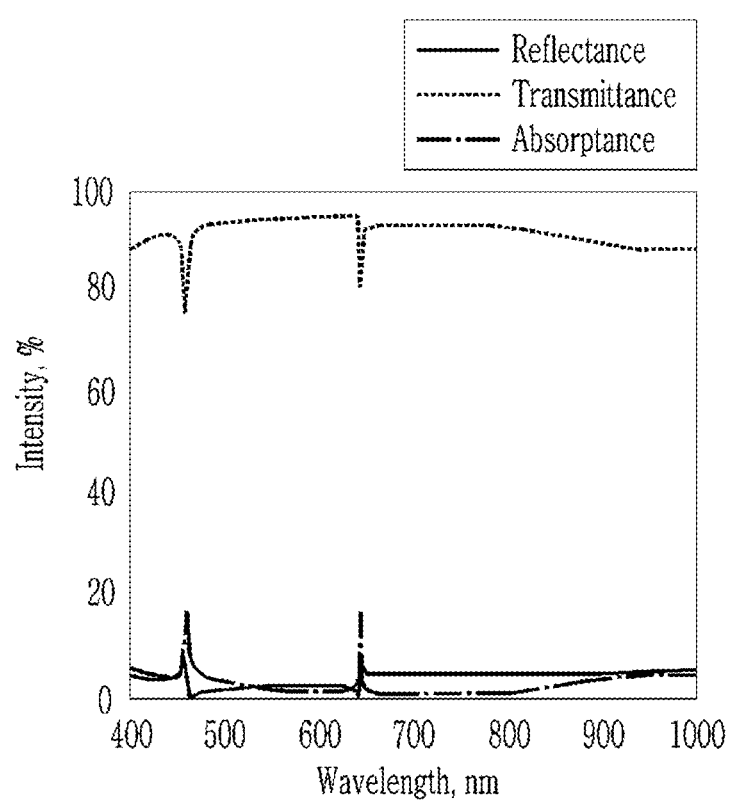
FIG. 25 is a graph showing an optical spectrum of the structure according to Comparative Example 3.
Figure 26:
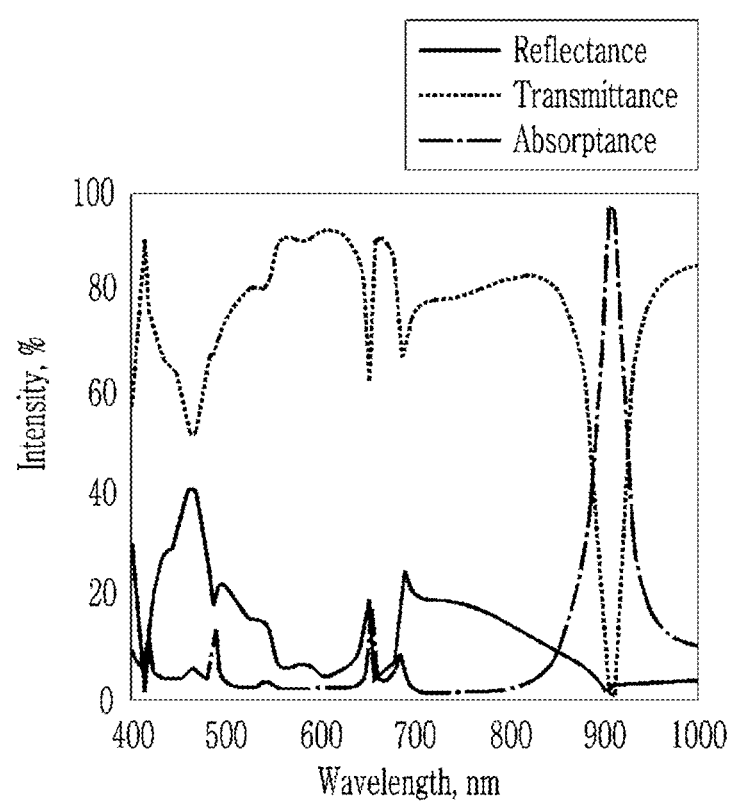
FIG. 26 is a graph showing an optical spectrum of the structure according to Comparative Example 4.

FIG. 19 is a graph showing an optical spectrum of the structure according to Example 1, FIG. 20 is a graph showing an optical spectrum of the structure according to Example 2, FIG. 21 is a graph showing an optical spectrum of the structure according to Example 3, FIG. 22 is a graph showing an optical spectrum of the structure according to Example 4, FIG. 23 is a graph showing an optical spectrum of the structure according to Comparative Example 1, FIG. 24 is a graph showing an optical spectrum of the structure according to Comparative Example 2, FIG. 25 is a graph showing an optical spectrum of the structure according to Comparative Example 3, and FIG. 26 is a graph showing an optical spectrum of the structure according to Comparative Example 4.

Referring to Table 3 and FIGS. 19 to 26, the combination structures according to Examples 1 to 4 exhibit higher light absorption characteristics and lower transmittance and/or reflectance in a near-infrared wavelength spectrum and higher transmittance in a visible wavelength spectrum than Comparative Examples 1 to 4.

Design and Evaluation of Combination Structure II

Example 5

A structure of disposing a light-absorbing layer and a hybrid nanostructure array on a SiO$_2$ base layer is designed. The hybrid nanostructure array includes a hybrid nanostructure of stacking a first nanostructure (Au), a second nanostructure (TiO$_2$), and a first nanostructure (Au) (shown in FIGS. 1, 2, and 4).
(1) Base layer
SiO$_2$ base layer
(2) Light-absorbing layer
Properties of the film according to Preparation Example 1
Thickness: 170 nm
(3) Hybrid nanostructure array
(Lower) first nanostructure: gold (Au)
Thickness of (lower) first nanostructure: 10 nm,
Second nanostructure: titanium oxide (TiO$_2$)
Thickness of second nanostructure: 100 nm,
(Upper) first nanostructure: gold (Au)
Thickness of (upper) first nanostructure: 10 nm,
Shape: cylinder
Shape of cross-section: rectangular shape
Diameter: 160 nm,
Period: 440 nm,
Gap: 280 nm Example 6

A structure is equally designed to Example 5 based on properties of the film of Preparation Example 2 instead of the film of Preparation Example 1.

Example 7

A structure is equally designed to Example 5 based on properties of the film of Preparation Example 3 instead of the film of Preparation Example 1.

TABLE 3

| | Absorbance (@$\lambda_{max, A}$, %) | Transmittance (@$\lambda_{max, A}$, %) | Reflectance (@$\lambda_{max, A}$, %) | $\lambda_{max, A}$ (nm) | Average Transmittance of Visible Light (430-565 nm) | Average Transmittance of Near-infrared Light (890-990 nm) |
|---|---|---|---|---|---|---|
| Example 1 | 65.5 | 25.30 | 9.2 | 918 | 87 | 43 |
| Example 2 | 57.8 | 8.4 | 33.8 | 923 | 79 | 22 |
| Example 3 | 58.7 | 22.9 | 18.4 | 928 | 83 | 40 |
| Example 4 | 49.1 | 18.8 | 32.1 | 930 | 79 | 34 |
| Comparative Example 1 | 0 | 97.5 | 2.5 | 940 | 99 | 97 |
| Comparative Example 2 | 41.5 | 13.0 | 45.5 | 946 | 85 | 31 |
| Comparative Example 3 | 5.3 | 88.8 | 5.9 | 940 | 93 | 89 |
| Comparative Example 4 | 97 | 2 | 1 | 909 | 71 | 58 |

Example 8

A structure is equally designed to Example 5 based on properties of the film of Preparation Example 4 instead of the film of Preparation Example 1.

Comparative Example 5

A structure is equally designed to Example 5 except that the light-absorbing layer is not included.

Evaluation II

Optical properties of the structures according Examples 5 to 8 and Comparative Example 5 are evaluated.

The results are shown in Table 4 and FIGS. 27 to 31.

Figure 27:
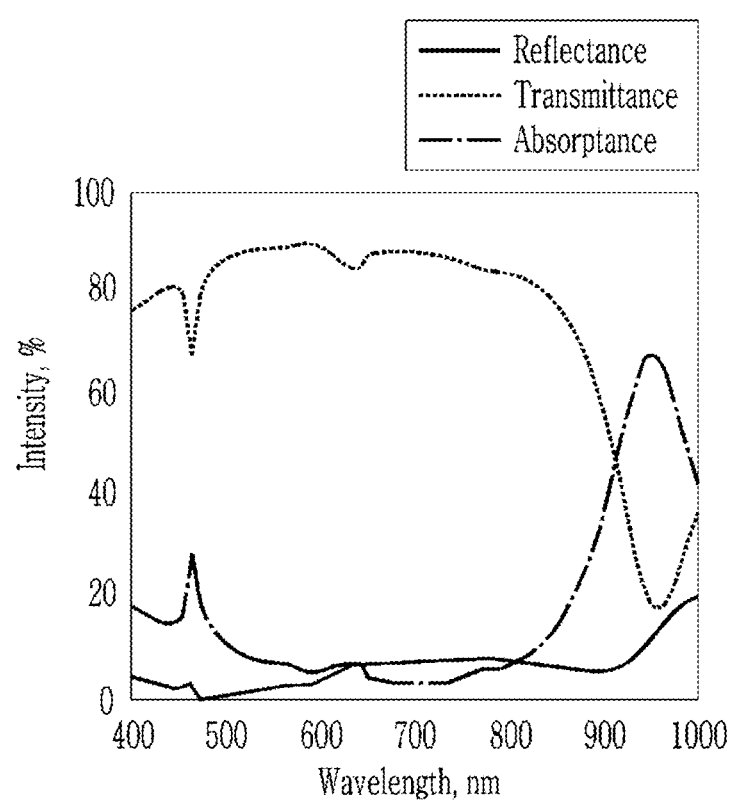
FIG. 27 is a graph showing an optical spectrum of the structure according to Example 5.
Figure 28:
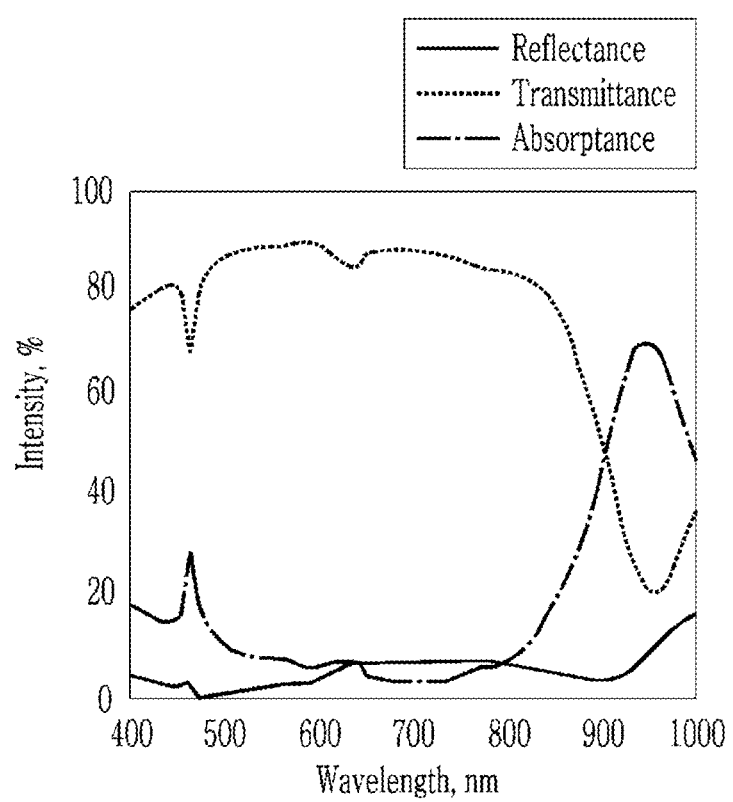
FIG. 28 is a graph showing an optical spectrum of the structure according to Example 6.
Figure 29:
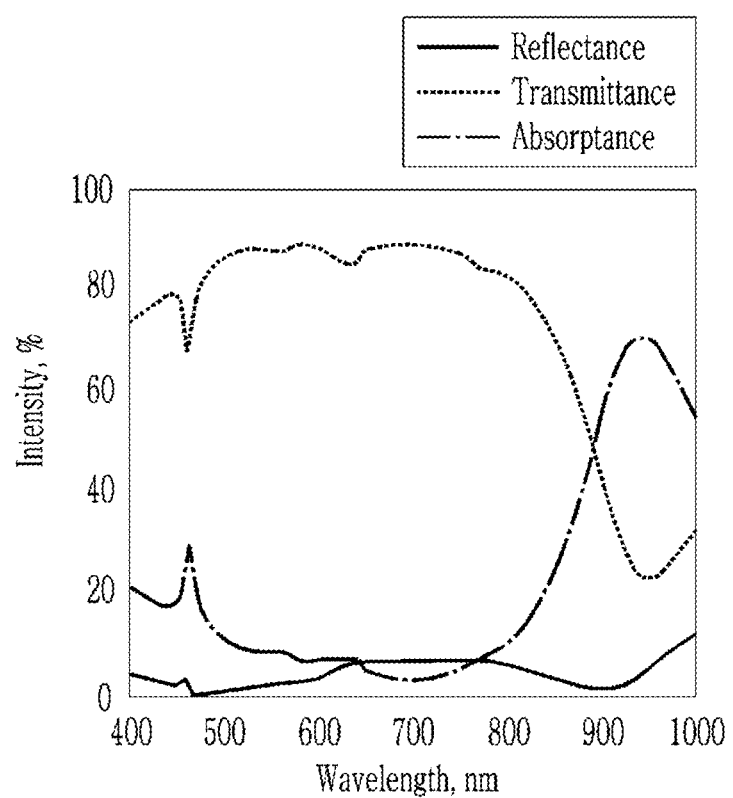
FIG. 29 is a graph showing an optical spectrum of the structure according to Example 7.
Figure 30:
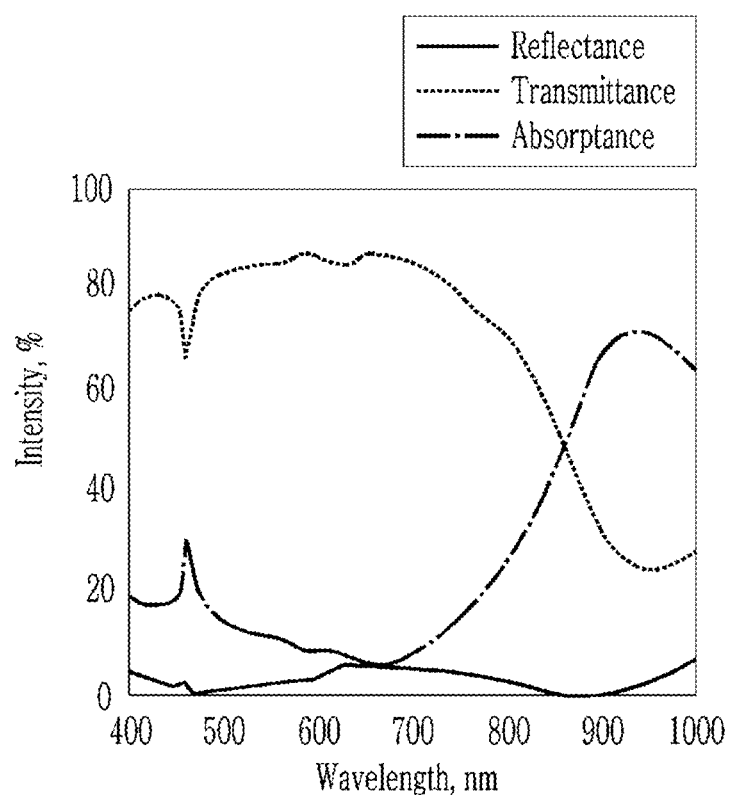
FIG. 30 is a graph showing an optical spectrum of the structure according to Example 8.
Figure 31:
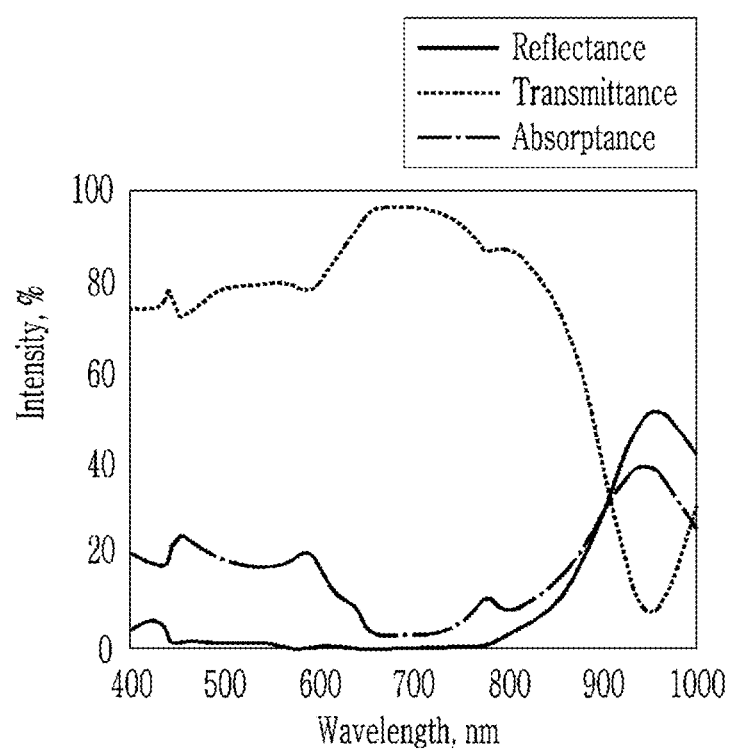
FIG. 31 is a graph showing an optical spectrum of the structure according to Comparative Example 5.

FIG. 27 is a graph showing an optical spectrum of the structure according to Example 5, FIG. 28 is a graph showing an optical spectrum of the structure according to Example 6, FIG. 29 is a graph showing an optical spectrum of the structure according to Example 7, FIG. 30 is a graph showing an optical spectrum of the structure according to Example 8, and FIG. 31 is a graph showing an optical spectrum of the structure according to Comparative Example 5.

TABLE 4

|  | Absorbance (@$\lambda_{max, A}$, %) | Transmittance (@$\lambda_{max, A}$, %) | Reflectance (@$\lambda_{max, A}$, %) | $\lambda_{max, A}$ (nm) | Average Transmittance of Visible Light (430-565 nm) | Average Transmittance of Near-infrared Light (890-990 nm) |
|---|---|---|---|---|---|---|
| Example 5 | 68.3 | 19.1 | 12.6 | 948 | 85 | 33 |
| Example 6 | 70.1 | 21.7 | 8.2 | 943 | 95 | 31 |
| Example 7 | 71.2 | 24.3 | 4.5 | 939 | 83 | 30 |
| Example 8 | 71.7 | 25.9 | 2.4 | 936 | 81 | 28 |
| Comparative Example 5 | 40.3 | 9.7 | 50.0 | 940 | 78 | 20 |

Referring to Table 4 and FIGS. 27 to 31, the structures of Examples 5 to 8 exhibit higher light absorption characteristics and lower transmittance and/or reflectance in a near-infrared wavelength spectrum and higher transmittance in a visible wavelength spectrum than Comparative Example 5. In addition, as an absorption coefficient of the light-absorbing layer is higher, a width of an absorption spectrum in the near-infrared wavelength spectrum is wider, and the reflectance is lower.

While this disclosure has been described in connection with what is presently considered to be practical example embodiments, it is to be understood that the inventive concepts are not limited to the above-described example embodiments. On the contrary, the inventive concepts are intended to cover various modifications and equivalent arrangements included within the spirit and scope of the appended claims.

What is claimed is:

1. A combination structure, comprising:
   a hybrid nanostructure array, the hybrid nanostructure array including a plurality of hybrid nanostructures, adjacent hybrid nanostructures of the plurality of hybrid nanostructures spaced apart by a gap space, each hybrid nanostructure of the plurality of hybrid nanostructures including a stack of a first nanostructure and a second nanostructure, the first nanostructure including a first material, the second nanostructure including a second material, the second material having a refractive index that is higher than a refractive index of the first material; and
   a light-absorbing layer adjacent to the hybrid nanostructure array, the light-absorbing layer including a near-infrared absorbing material configured to selectively absorb light of at least a portion of a near-infrared wavelength spectrum.

2. The combination structure of claim 1, wherein one or more hybrid nanostructures of the hybrid nanostructure array has a dimension that is smaller than a particular near-infrared wavelength.

3. The combination structure of claim 2, wherein the particular near-infrared wavelength is in a range of greater than about 700 nm and less than or equal to about 1200 nm.

4. The combination structure of claim 2, wherein the particular near-infrared wavelength is in a range of about 890 nm to about 990 nm.

5. The combination structure of claim 1, wherein the first material includes a metal having a refractive index of less than about 1.0 in a wavelength range of about 900 nm to about 1000 nm.

6. The combination structure of claim 1, wherein the first material includes gold, silver, copper, an alloy thereof, or a combination thereof.

7. The combination structure of claim 1, wherein the refractive index of the second material is greater than or equal to about 2.0 in a wavelength range of about 900 nm to about 1000 nm.

8. The combination structure of claim 1, wherein the second material includes a metal oxide, silicon, a Group III-V semiconductor compound, or a combination thereof.

9. The combination structure of claim 1, wherein
   the first material includes gold, silver, copper, an alloy thereof, or a combination thereof, and
   the second material includes a metal oxide, silicon, a Group III-V semiconductor compound, or a combination thereof.

10. The combination structure of claim 1, wherein a thickness of the first nanostructure is smaller than a thickness of the second nanostructure.

11. The combination structure of claim 10, wherein
   the thickness of the first nanostructure is in a range of about 5 nm to about 50 nm, and
   the thickness of the second nanostructure is in a range of about 10 nm to about 700 nm.

12. The combination structure of claim 1, wherein the near-infrared absorbing material is configured to absorb light of at least a portion of a wavelength in a wavelength range of greater than about 700 nm and less than or equal to about 1200 nm.

13. The combination structure of claim 12, wherein a maximum absorption wavelength of the near-infrared absorbing material is in a wavelength range of about 890 nm to about 990 nm.

14. The combination structure of claim 1, wherein the light-absorbing layer contacts at least one of a lower surface, an upper surface, or one or more side surfaces of one or more hybrid nanostructures of the plurality of hybrid nanostructures.

15. The combination structure of claim 1, wherein
an optical spectrum of the combination structure has a maximum absorption wavelength in a wavelength range of greater than about 700 nm and less than or equal to about 1200 nm, and
transmittance at the maximum absorption wavelength is less than or equal to about 50%.

16. The combination structure of claim 15, wherein a reflectance at the maximum absorption wavelength of the combination structure is less than about 40%.

17. The combination structure of claim 1, wherein the combination structure has an average transmittance of less than or equal to about 50% in a wavelength spectrum of about 890 nm to about 990 nm.

18. The combination structure of claim 1, wherein the combination structure has an average transmittance of greater than or equal to about 75% in a wavelength spectrum of about 430 nm to about 565 nm.

19. The combination structure of claim 1, wherein a thickness of the combination structure is less than or equal to about 1 μm.

20. An optical filter comprising the combination structure of claim 1.

21. A camera comprising the optical filter of claim 20.

22. An electronic device comprising the camera of claim 21.

23. An electronic device comprising the optical filter of claim 20.

24. An image sensor, comprising:
a semiconductor substrate including a plurality of photodiodes; and
an optical filter on the semiconductor substrate, the optical filter configured to block light of at least a portion of a near-infrared wavelength spectrum,
wherein the optical filter includes the combination structure of claim 1.

25. The image sensor of claim 24, further comprising:
a color filter on the semiconductor substrate,
wherein the color filter is above or beneath the optical filter.

26. The image sensor of claim 24, further comprising:
a dual bandpass filter, the dual bandpass filter being configured to selectively transmit light of an entirety of a visible wavelength spectrum and the portion of the near-infrared wavelength spectrum.

27. A camera comprising the image sensor of claim 24.

28. An electronic device comprising the camera of claim 27.

29. An electronic device comprising the image sensor of claim 24.

* * * * *